(12) United States Patent
Nagatani et al.

(10) Patent No.: US 7,020,447 B2
(45) Date of Patent: Mar. 28, 2006

(54) METHOD AND APPARATUS FOR COMPENSATING FOR DISTORTION IN RADIO APPARATUS

(75) Inventors: Kazuo Nagatani, Kawasaki (JP); Yasuyuki Oishi, Kawasaki (JP); Tokuro Kubo, Kawasaki (JP); Takayoshi Ode, Kawasaki (JP); Takeshi Takano, Kawasaki (JP); Toru Maniwa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 473 days.

(21) Appl. No.: 10/010,263

(22) Filed: Dec. 6, 2001

(65) Prior Publication Data

US 2002/0065048 A1    May 30, 2002

Related U.S. Application Data

(63) Continuation of application No. PCT/JP99/04037, filed on Jul. 28, 1999.

(51) Int. Cl.
*H04B 1/04* (2006.01)

(52) U.S. Cl. ............... 455/114.3; 455/63.1; 375/297

(58) Field of Classification Search .............. 455/69, 455/63.1, 522, 114.3, 126; 375/296, 297
See application file for complete search history.

(56) References Cited

U.S. PATENT DOCUMENTS

| | | | |
|---|---|---|---|
| 4,700,151 A | | 10/1987 | Nagata |
| 5,164,678 A | | 11/1992 | Puri et al. |
| 5,699,383 A | * | 12/1997 | Ichiyoshi ............ 375/297 |
| 5,903,611 A | | 5/1999 | Schnabl et al. |
| 5,923,712 A | * | 7/1999 | Leyendecker et al. ...... 375/297 |
| 6,288,610 B1 | * | 9/2001 | Miyashita ............ 330/149 |
| 6,342,810 B1 | | 1/2002 | Wright et al. |
| 6,356,146 B1 | | 3/2002 | Wright et al. |
| 6,400,774 B1 | * | 6/2002 | Matsuoka et al. ........ 375/295 |
| 6,418,173 B1 | * | 7/2002 | Matsuoka et al. ........ 375/297 |
| 6,459,334 B1 | | 10/2002 | Wright et al. |
| 6,476,670 B1 | | 11/2002 | Wright et al. |
| 6,587,514 B1 | | 7/2003 | Wright et al. |

FOREIGN PATENT DOCUMENTS

| | | |
|---|---|---|
| JP | 58084558 | 5/1983 |
| JP | 62139425 | 6/1987 |
| JP | 63121326 | 5/1988 |
| JP | 091164741 | 5/1997 |
| JP | 10136048 | 5/1998 |
| JP | 10145146 | 5/1998 |

OTHER PUBLICATIONS

Nagatani, et al. Simulated Tolerance of Loop Parameters of Cartesian Feedback Amplifier for π/4 Shifted QPSK Transmitter Jun. 26, 1992, pp. 25-30.

IEEE Transactions on Signal Processing Jun. 1998 vol. 6 pp. 1726-1730.

* cited by examiner

*Primary Examiner*—Lee Nguyen
(74) *Attorney, Agent, or Firm*—Katten Muchin Rosenman LLP

(57) ABSTRACT

Distortion compensation coefficients for correcting distortion of a transmission power amplifier are stored in a memory beforehand, a distortion compensation coefficient conforming to powers or amplitudes of a present transmit signal and a past transmit signal is read out of the memory, and distortion compensation processing is applied to the transmit signal using this distortion compensation coefficient. The transmit signal thus subjected to distortion compensation processing is then amplified by the transmission power amplifier and the amplified signal is transmitted, and the distortion compensation coefficient is updated based upon the transmit signal before distortion compensation and an output signal from the transmission power amplifier.

5 Claims, 25 Drawing Sheets

FIG. 3

| $P(t)$ | $\Delta P$ | $h(P(t), \Delta P)$ |
|---|---|---|
| $P_1$ | $\Delta P_1$ | $h(P_1, \Delta P_1)$ |
|  | $\Delta P_2$ | $h(P_1, \Delta P_2)$ |
|  | $\Delta P_3$ | $h(P_1, \Delta P_3)$ |
|  | ⋮ | ⋮ |
|  | $\Delta P_n$ | $h(P_1, \Delta P_n)$ |
| $P_2$ | $\Delta P_1$ | $h(P_2, \Delta P_1)$ |
|  | $\Delta P_2$ | $h(P_2, \Delta P_2)$ |
|  | $\Delta P_3$ | $h(P_2, \Delta P_3)$ |
|  | ⋮ | ⋮ |
|  | $\Delta P_n$ | $h(P_2, \Delta P_n)$ |
| $P_3$ |  |  |
| ⋮ | ⋮ | ⋮ |
| $P_m$ | $\Delta P_1$ | $h(P_m, \Delta P_1)$ |
|  | $\Delta P_2$ | $h(P_m, \Delta P_2)$ |
|  | $\Delta P_3$ | $h(P_m, \Delta P_3)$ |
|  | ⋮ | ⋮ |
|  | $\Delta P_n$ | $h(P_m, \Delta P_n)$ |

| ITEM | SPECIFICATIONS |
|---|---|
| CHIP RATE | 4.096 Mbps |
| CARRIER RATE | 64 kbps |
| NUMBER OF MULTIPLEXED SIGNALS | 60 CODES |
| PEAK SUPPRESSION | 13.5 CODES |
| CHIP SHAPING FILTER | ROUTE NYQUIST ($\alpha$=0.22) |

FIG. 12

| P(t) | P(t-1) | h(P(t), P(t-1)) |
|---|---|---|
| P1 | P1 | h(P1, P1) |
|  | P2 | h(P1, P2) |
|  | P3 | h(P1, P3) |
|  | ⋮ | ⋮ |
|  | Pn | h(P1, Pn) |
| P2 | P1 | h(P2, P1) |
|  | P2 | h(P2, P2) |
|  | P3 | h(P2, P3) |
|  | ⋮ | ⋮ |
|  | Pn | h(P2, Pn) |
| P3 | ⋮ | ⋮ |
| ⋮ | ⋮ | ⋮ |
| Pm | P1 | h(Pm, P1) |
|  | P2 | h(Pm, P2) |
|  | P3 | h(Pm, P3) |
|  | ⋮ | ⋮ |
|  | Pn | h(Pm, Pn) |

FIG. 15

| P(t) | P(t-1) | P(t-2) | h(P(t), P(t-1), P(t-2)) |
|---|---|---|---|
| $P_1$ | $P_1$ | $P_1$ | h($P_1$, $P_1$, $P_1$) |
| | | $P_2$ | h($P_1$, $P_1$, $P_2$) |
| | | ⋮ | ⋮ |
| | | $P_n$ | h($P_1$, $P_1$, $P_n$) |
| | $P_2$ | $P_1$ | h($P_1$, $P_2$, $P_1$) |
| | | $P_2$ | h($P_1$, $P_1$, $P_2$) |
| | | ⋮ | ⋮ |
| | | $P_n$ | h($P_1$, $P_2$, $P_n$) |
| | ⋮ | ⋮ | ⋮ |
| | $P_n$ | $P_1$ | h($P_1$, $P_n$, $P_1$) |
| | | $P_2$ | h($P_1$, $P_n$, $P_2$) |
| | | ⋮ | ⋮ |
| | | $P_n$ | h($P_1$, $P_n$, $P_n$) |
| $P_2$ | $P_1$ | $P_1$ | h($P_2$, $P_1$, $P_1$) |
| | | $P_2$ | h($P_2$, $P_1$, $P_2$) |
| | | ⋮ | ⋮ |
| | | $P_n$ | h($P_2$, $P_1$, $P_n$) |
| ⋮ | $P_2$ | | |
| ⋮ | ⋮ | ⋮ | ⋮ |
| $P_m$ | | | |

FIG. 18

| P(t) | ΔP | ΔP' | h(P(t), ΔP, ΔP') |
|---|---|---|---|
| P₁ | ΔP₁ | ΔP₁ | h(P₁, ΔP₁, ΔP₁) |
| | | ΔP₂ | h(P₁, ΔP₁, ΔP₂) |
| | | ⋮ | ⋮ |
| | | ΔPₙ | h(P₁, ΔP₁, ΔPₙ) |
| | ΔP₂ | ΔP₁ | h(P₁, ΔP₂, ΔP₁) |
| | | ΔP₂ | h(P₁, ΔP₂, ΔP₂) |
| | | ⋮ | ⋮ |
| | | ΔPₙ | h(P₁, ΔP₂, ΔPₙ) |
| | ⋮ | ⋮ | ⋮ |
| | ΔPₙ | ΔP₁ | h(P₁, ΔPₙ, ΔP₁) |
| | | ΔP₂ | h(P₁, ΔPₙ, ΔP₂) |
| | | ⋮ | ⋮ |
| | | ΔPₙ | h(P₁, ΔPₙ, ΔPₙ) |
| P₂ | ΔP₁ | ΔP₁ | h(P₂, ΔP₁, ΔP₁) |
| | | ΔP₂ | h(P₂, ΔP₁, ΔP₂) |
| | | ⋮ | ⋮ |
| | | ΔPₙ | h(P₂, ΔP₁, ΔPₙ) |
| | ΔP₂ | ⋮ | ⋮ |
| ⋮ | ⋮ | ⋮ | ⋮ |
| Pₘ | | | |

| I(t) | Δi | hi(I(t), Δi) |
|---|---|---|
| | Δi1 | hi(I1, Δi1) |
| | Δi2 | hi(I1, Δi2) |
| I1 | Δi3 | hi(I1, Δi3) |
| | ⋮ | ⋮ |
| | Δin | hi(I1, Δin) |
| | Δi1 | hi(I2, Δi1) |
| | Δi2 | hi(I2, Δi2) |
| I2 | Δi3 | hi(I2, Δi3) |
| | ⋮ | ⋮ |
| | Δin | hi(I2, Δin) |
| I3 ⋮ | | |
| | Δi1 | hi(Im, Δi1) |
| | Δi2 | hi(Im, Δi2) |
| Im | Δi3 | hi(Im, Δi3) |
| | ⋮ | ⋮ |
| | Δin | hi(Im, Δin) |

(b)

| Q(t) | Δq | hq(Q(t), Δq) |
|---|---|---|
| | Δq1 | hq(Q1, Δq1) |
| | Δq2 | hq(Q1, Δq2) |
| Q1 | Δq3 | hq(Q1, Δq3) |
| | ⋮ | ⋮ |
| | Δqn | hq(Q1, Δqn) |
| | Δq1 | hq(Q2, Δq1) |
| | Δq2 | hq(Q2, Δq2) |
| Q2 | Δq3 | hq(Q2, Δq3) |
| | ⋮ | ⋮ |
| | Δqn | hq(Q2, Δqn) |
| Q3 ⋮ | | |
| | Δq1 | hq(Qm, Δq1) |
| | Δq2 | hq(Qm, Δq2) |
| Qn | Δq3 | hq(Qm, Δq3) |
| | ⋮ | ⋮ |
| | Δqm | hq(Qm, Δqn) |

METHOD AND APPARATUS FOR COMPENSATING FOR DISTORTION IN RADIO APPARATUS

This application is a continuation of International Application No. PCT/JP99/04037, filed Jul. 28, 1999.

BACKGROUND OF THE INVENTION

This invention relates to a method and apparatus for compensating for distortion in a radio apparatus and, more particularly, to a distortion compensation method and distortion compensation apparatus for suppressing non-linear distortion of a transmission power amplifier in a radio apparatus and reducing leakage of power between adjacent channels.

Frequency resources have become tight in recent years and in wireless communications there is growing use of high-efficiency transmission using digital techniques. In instances where multilevel amplitude modulation is applied to wireless communications, a vital technique is one which can suppress non-linear distortion by linearizing the amplitude characteristic of the power amplifier on the transmitting side and reduce the leakage of power between adjacent channels. Also essential is a technique which compensates for the occurrence of distortion that arises when an attempt is made to improve power efficiency by using an amplifier that exhibits poor linearity.

FIG. 22 is a block diagram illustrating an example of a transmitting apparatus in a radio according to the prior art. Here a transmit-signal generator 1 transmits a serial digital data sequence and a serial/parallel (S/P) converter 2 divides the digital data sequence alternately one bit at a time to convert the data to two sequences, namely an in-phase component signal (also referred to as an "I signal") and a quadrature component signal (also referred to as a "Q signal"). A DA converter 3 converts the I and Q signals to respective analog baseband signals and inputs these to a quadrature modulator 4. The latter multiplies the input I and Q signals (the transmit baseband signals) by a reference carrier wave and a signal that has been phase-shifted relative to the reference carrier by 90° and sums the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into the atmosphere from an antenna 7.

In such a transmitting apparatus, the input/output characteristic [distortion function f(p)] of the transmission power amplifier is non-linear, as indicated by the dotted line in (a) of FIG. 23. Non-linear distortion arises as a result of non-linear characteristics, and the frequency spectrum in the vicinity of a transmission frequency $f_0$ develops side lobes, as shown in (b) of FIG. 23, leakage into the adjacent channel occurs and this causes interference between adjacent channels. For this reason, the Cartesian-loop method and polar-loop method, etc., have been proposed as techniques for effecting distortion compensation by feedback and these methods are used to suppress the distortion of power amplifiers.

FIG. 24 is a block diagram of a transmitting apparatus having a digital non-linear distortion compensating function that employs a DSP. Here a group of digital data (a modulation signal) sent from the transmit-signal generator 1 is converted to two signal sequences, namely I and Q signals, by the S/P converter 2, and these signals enter a predistorter 8 constituted by a DSP. As illustrated in FIG. 25, the distortion compensator 8 functionally comprises a distortion compensation coefficient memory 8a for storing distortion compensation coefficients h(pi) (i=0~1023) conforming to power levels 0~1023 of the modulation signal; a predistortion unit 8b for subjecting the modulation signal to distortion compensation processing (predistortion) using a distortion compensation coefficient h(pi) that is in conformity with the level of the modulation signal; and a distortion compensation coefficient calculation unit 8c for comparing the modulation signal with a demodulated signal, which has been obtained by demodulation in a quadrature detector described later, and for calculating and updating the distortion compensation coefficient h(pi) in such a manner that the difference between the compared signals will approach zero.

The distortion compensator 8 subjects the modulation signal to predistortion processing using the distortion compensation coefficient h(pi) that conforms to the level of the modulation signal, and inputs the processed signal to the DA converter 3. The latter converts the input I and Q signals to analog baseband signals and applies the baseband signals to the quadrature modulator 4. The latter multiplies the input I and Q signals by a reference carrier wave and a signal that has been phase-shifted relative to the reference carrier by 90°, respectively, and sums the results of multiplication to thereby perform quadrature modulation and output the modulated signal. The frequency converter 5 mixes the quadrature-modulated signal and a local oscillation signal to thereby effect a frequency conversion, and the transmission power amplifier 6 power-amplifies the carrier signal output from the frequency converter 5. The amplified signal is released into the atmosphere from the antenna 7. Part of the transmit signal is input to a frequency converter 10 via a directional coupler 9, whereby the signal undergoes a frequency conversion and is input to a quadrature detector 11. The latter performs quadrature detection by multiplying the input signal by a reference carrier wave and a signal that has been phase-shifted relative to the reference carrier by 90°, reproduces the I, Q signals of the baseband on the transmitting side and applies these signals to an AD converter 12. The latter converts the applied I and Q signals to digital data and inputs the digital data to a distortion compensator 8. By way of adaptive signal processing using the LMS (Least Mean Square) algorithm, the distortion compensator 8 compares the modulation signal with the demodulated obtained by demodulation in the quadrature detector 11 and proceeds to calculate and update the distortion compensation coefficient h(pi) in such a manner that the difference between the compared signals will become zero. The modulation signal to be transmitted next is then subjected to predistortion processing using the updated distortion compensation coefficient and the processed signal is output. By thenceforth repeating this operation, non-linear distortion of the transmission power amplifier 6 is suppressed to reduce the leakage of power between adjacent channels.

FIG. 26 is a diagram useful in describing distortion compensation processing by an adaptive LMS. A multiplier (which corresponds to the predistortion unit 8b in FIG. 25) 15a multiplies the modulation signal (the input baseband signal) x(t) by a distortion compensation coefficient $h_{n-1}(p)$. A transmission power amplifier 15b has a distortion function f(p). A feedback loop 15c feeds back the output signal y(t) from the transmission power amplifier and an arithmetic unit (amplitude-to-power converter) 15d calculates the power p $[=x(t)^2]$ of the modulation signal x(t). A distortion compensation coefficient memory (which corresponds to the distortion compensation coefficient memory 8a of FIG. 25) 15e stores the distortion compensation coefficients that conform to the power levels of the modulation signal x(t). The memory 15e outputs the distortion compensation coefficient $h_{n-1}(p)$ conforming to the power p of the modulation signal x(t) and updates the distortion compensation coefficient $h_{n-1}(p)$ by a distortion compensation coefficient $h_n(p)$ found by the LMS algorithm.

Reference characters 15f denote a complex-conjugate signal output unit 15f. A subtractor 15g outputs the difference e(t) between the modulation signal x(t) and the feedback demodulated signal y(t), a multiplier 15h performs multiplication between e(t) and u*(t), a multiplier 15i performs multiplication between $h_{n-1}(p)$ and y*(t), a multiplier 15j performs multiplication by a step-size parameter μ, and an adder 15k adds $h_{n-1}(p)$ and μe(t)u*(t). Reference characters 15m, 15n, 15p denote delay units. A delay time, which is equivalent to the length of time from the moment the transmit signal x(t) enters to the moment the feedback (demodulated) signal y(t) is input to the subtractor 15g, is added onto the input signal. The units 15f~15j construct a rotation calculation unit 16. A signal that has sustained distortion is indicated at u(t). The arithmetic operations performed by the arrangement set forth above are as follows:

$$h_n(p)=h_{n-1}(p)+\mu e(t)u^*(t)$$

$$e(t)=x(t)-y(t)$$

$$y(t)=h_{n-1}(p)x(t)f(p)$$

$$u(t)=x(t)f(p)=h^*_{n-1}(p)y(t)$$

$$P=|x(t)|^2$$

where x, y, f, h, u, e represent complex numbers and * signifies a complex conjugate. By executing the processing set forth above, the distortion compensation coefficient h(p) is updated so as to minimize the difference e(t) between the transmit signal x(t) and the feedback (demodulated) signal y(t), and the coefficient eventually converges to the optimum distortion compensation coefficient h(p) so that compensation is made for the distortion in the transmission power amplifier.

FIG. 27 is a diagram showing the overall construction of a transmitting apparatus expressed by x(t)=I(t)+jQ(t). Components in FIG. 27 identical with those shown in FIGS. 24 and 26 are designated by like reference characters.

As mentioned above, the principle of digital non-linear distortion compensation is to feed back and detect a carrier obtained by quadrature modulation by a modulating signal, digitally convert and compare the amplitudes of the modulating signal (transmit baseband signal) and feedback signal (feedback baseband signal), and update the distortion compensation coefficient in real time based upon the comparison.

As indicated by a frequency spectrum FS1 in FIG. 28, a phenomenon (frequency asymmetric distortion) occurs in which the actual transmission power amplifier generates unnecessary radiation power that differs between positive and negative frequency regions with respect to a center frequency $f_0$. Further, frequency asymmetric distortion differs depending upon individual differences among devices. The reason for this phenomenon is that the distortion function of a transmission power amplifier depends not only upon the instantaneous value p of input power but also upon the value of input power in the past.

With conventional distortion compensation processing (predistortion), distortion compensation coefficients are updated on the assumption that the distortion function f(p) is dependent solely upon the instantaneous value p of input power. As a consequence, a frequency spectrum FS2 in a case where conventional distortion compensation processing (predistortion) has been carried out becomes as shown in FIG. 28, and a problem which arises is that although a distortion suppression effect is obtained, the suppression effect is not satisfactory.

SUMMARY OF THE INVENTION

Accordingly, an object of the present invention is to so arrange it that frequency asymmetric distortion can be compensated for so that a satisfactory distortion suppression effect can manifest itself.

A further object of the present invention is eliminate a variance in the distortion compensation effect caused by individual differences among devices.

In accordance with the present invention, distortion compensation coefficients for correcting distortion of a transmission power amplifier are stored in a memory, a distortion compensation coefficient conforming to a present transmit signal and a past transmit signal is read out of the memory, distortion compensation processing is applied to the transmit signal using this distortion compensation coefficient, the transmit signal to which distortion compensation processing has been applied is amplified and transmitted, and the distortion compensation coefficient is updated based upon the transmit signal before distortion compensation and an output signal from the transmission power amplifier. By thus obtaining a distortion compensation coefficient of the transmission power amplifier as a function of present and past transmit signals and applying compensation using this distortion compensation coefficient, frequency asymmetric distortion can be suppressed satisfactorily and a variance in the distortion compensation effect caused by individual differences among devices can be eliminated.

In this case, distortion compensation processing is executed upon reading one distortion compensation coefficient, which corresponds to a present transmit signal and a plurality of signals transmitted in the past, out of the memory.

Further, distortion compensation processing is executed upon reading a distortion compensation coefficient, which corresponds to a present transmit signal and a signal transmitted previously, out of the memory.

Further, distortion compensation processing is executed upon reading a distortion compensation coefficient, which corresponds to a present transmit signal and a difference between the present signal and a signal transmitted previously, out of the memory.

Further, distortion compensation processing is executed upon reading a distortion compensation coefficient, which corresponds to an instantaneous value of a present transmit signal and an envelope differential value, out of the memory.

Further, distortion compensation processing is executed upon reading a distortion compensation coefficient, which corresponds to a power value of a present transmit signal and a power value of signal transmitted in the past, out of the memory.

Further, distortion compensation processing is executed upon reading a distortion compensation coefficient, which corresponds to an amplitude value of a present transmit signal and an amplitude value of signal transmitted in the past, out of the memory.

BRIEF DESCRIPTION OF THE DRAWINGS

FIG. 3 is a diagram useful in describing a table of distortion compensation coefficients;

FIG. 12 is a diagram useful in describing a table of distortion compensation coefficients;

FIG. 15 is a diagram useful in describing a table of distortion compensation coefficients;

FIG. 18 is a diagram useful in describing a table of distortion compensation coefficients;

FIG. 20 is a diagram useful in describing a table of distortion compensation coefficients according to the second embodiment;

DESCRIPTION OF THE PREFERRED EMBODIMENTS (A) Basic Structure of the Present Invention FIG. 1 is a diagram showing the basic structure of the present invention. Numeral 21 denotes a transmit-signal generator, 22 distortion compensation coefficient table (a memory such as a RAM) for storing distortion compensation coefficients that correct distortion of the transmission power amplifier, and 23 an address generator, which has a delay unit DLC that stores a present transmit-signal value and one or more past transmit-signal values, for outputting an address signal of the distortion compensation coefficient table (RAM) on the basis of these signal values. Numeral 24 denotes a distortion compensation application unit for applying distortion compensation processing to the transmit signal using the present transmit-signal value and one or more past transmit-signal values, 25 a distortion compensation coefficient updating unit for updating distortion compensation coefficients and storing them in the distortion compensation coefficient table 22, 26 a modulator for modulating the transmit signal, 27 a transmission power amplifier, 28 an antenna, 29 a directional coupler for branching part of the output signal of the transmission power amplifier, and 30 a demodulator for demodulating the output signal of the transmission power amplifier.

Figure 1:
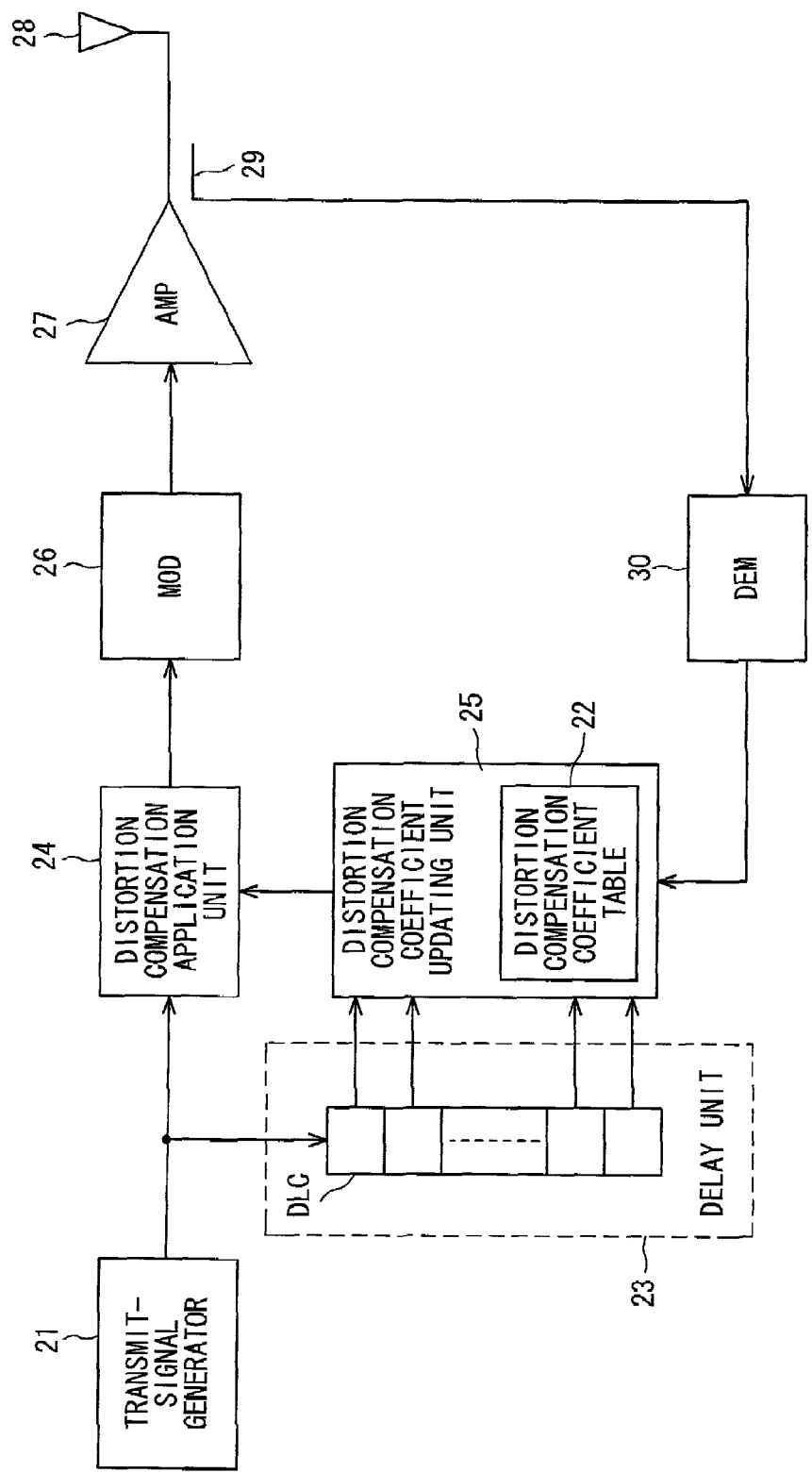
FIG. 1 is a diagram showing the basic structure of the present invention.

Initial values of distortion compensation coefficients for correcting distortion of the transmission power amplifier 27 are stored in the memory 23 in advance. If a transmit signal is generated by the transmit-signal generator 21, the address generator 23 generates an address A corresponding to the present transmit signal and a past transmit signal, reads out a distortion compensation coefficient from this address and inputs the coefficient to the distortion compensation application unit 24. The latter applies distortion compensation processing to the transmit signal using this distortion compensation coefficient and outputs the processed signal. The modulator 26 modulates the transmit signal that has been compensated for distortion, and the transmission power amplifier 27 amplifies the modulated signal and transmits it from an antenna 28. The demodulator 30 demodulates the output signal of the transmission power amplifier 27 that enters from the directional coupler 29 and inputs the demodulated signal to the distortion compensation coefficient updating unit 25. The latter updates the above-mentioned distortion compensation coefficient in such a manner that the difference between the transmit signal before distortion compensation and the demodulated signal becomes zero and stores the updated coefficient at the address A.

(B) First Embodiment

Figure 2:
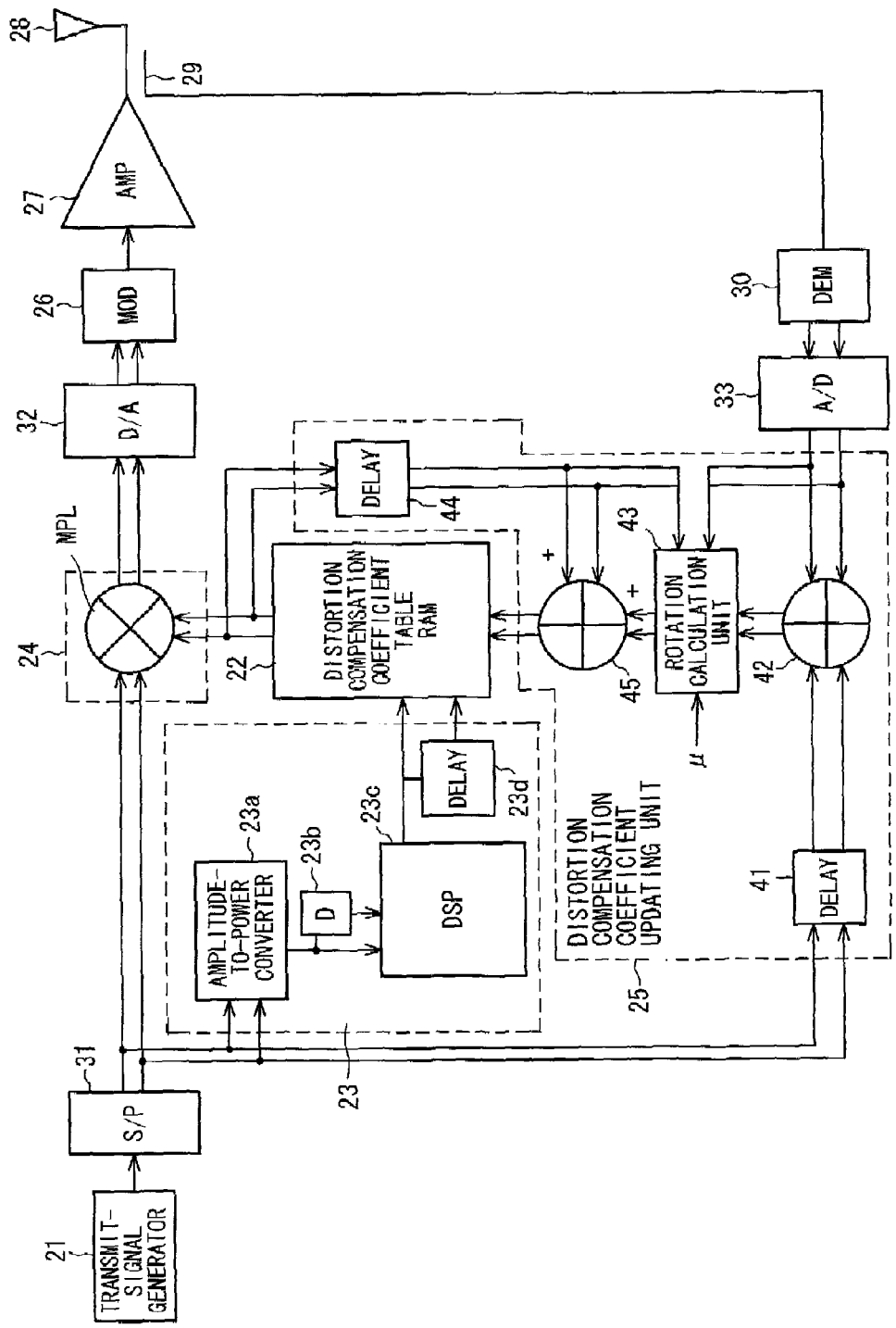
FIG. 2 is a diagram showing the structure of a first embodiment of the present invention.

FIG. 2 is a diagram showing the structure of a first embodiment of the present invention. This is an example in which a distortion compensation scheme in a complex baseband system is adopted as the distortion compensation scheme. Components identical with those of the first embodiment are designated by like reference characters. The first embodiment is an example in which a distortion compensation coefficient is found as a function of power p(t) of the present transmit signal and a difference Δp between present transmission power and the transmission power that preceded it.

Numeral 31 denotes a serial/parallel (S/P) converter 2 for dividing serial data, which is output from the transmit-signal generator 21, alternately one bit at a time to convert the data to two sequences, namely an in-phase component signal (I signal) and a quadrature component signal (Q signal). Numeral 32 denotes a DA converter for converting, to analog signals, the distortion-compensated quadrature signals (I and Q signals) output from the distortion compensation application unit 24. Numeral 33 denotes an AD converter for converting, to digital signals, quadrature-demodulated signals (I' and Q' signals) output from the demodulator 30.

Complex-number distortion compensation coefficients h[p(t),Δp] are stored in the distortion compensation coefficient table 22 in correspondence with combinations of p(t) and Δp, as shown in FIG. 3, where p(t) represents the present transmission signal power, p(t−1) the transmission power value that preceded it and Δp [=p(t)−p(t−1)] the difference between these power values.

The address generator 23 has an amplitude-to-power converter 23a for calculating the power value of the transmit signal in accordance with $p(t)=I(t)^2+Q(t)^2$,; a delay circuit 23b for outputting a power value $p(t-1)$ that is earlier by a time $\Delta t$; an address calculation unit 23c, to which (p), p(t-1) are input, for generating an address A $[p(t),\Delta p]$, where p(t) represents a high-order address and $\Delta p$ $[=p(t)-p(t-1)]$ a low-order address; and a delay circuit 23d for outputting the address A $[p(t),\Delta p]$ after a time $\Delta t$.

The distortion compensation application unit 24 subjects the quadrature signal to distortion compensation processing by executing complex multiplication between the quadrature signal I+jQ and distortion compensation coefficient $h_{n-1}[p(t),\Delta p]$ that has been read out from the address A $[p(t),\Delta p]$. On the assumption that the distortion compensation coefficient h $[p(t),\Delta p]$ that has been stored at address A $[p(t),\Delta p]$ is $h_i+jh_q$, the distortion compensation application unit 24 performs the following operation:

$$(I+jQ) \times (h_i+jh_q)$$

and output a distortion-compensated quadrature signal $$(I \cdot h_i - Q \cdot h_q) + j(I \cdot h_q + Q \cdot h_i)$$

The distortion compensation coefficient updating unit 25 updates the distortion compensation coefficient $h_{n-1}[p(t),\Delta p]$, which has been read out from the address A $[p(t),\Delta p]$, by adaptive signal processing using the LMS algorithm or RLS algorithm in such a manner that the difference between the quadrature signal before distortion compensation and the demodulated signal that is output from the demodulator (quadrature detector) 30 will become zero $\{h_{n-1}[p(t),\Delta p] \rightarrow h_n[p(t),\Delta p]\}$, and stores the distortion compensation coefficient $h_n[p(t),\Delta p]$ after updating at the original address A $[p(t),\Delta p]$. That is, in the distortion compensation coefficient updating unit 25, the delay circuit 41 delays the quadrature signal, which is output from the S/P converter 31, for a predetermined period of time, a subtractor 42 outputs an error e(t) between the quadrature signal x(t) $[=I(t)+jQ(t)]$ and the feedback demodulated signal y(t) $[=I(t)'+jQ(t)']$, a rotation calculation unit 43 applies rotation calculation to the error signal e(t), a delay circuit 44 delays the distortion compensation coefficient $h_{n-1}[p(t),\Delta p]$ for a predetermined period of time, and an adder 45 adds the result of the rotation calculation and the distortion compensation coefficient $h_{n-1}[p(t),\Delta p]$ and stores the updated distortion compensation coefficient $h_n[p(t),\Delta p]$ at the memory address A $[p(t),\Delta p]$.

Now to describe overall processing, initial values of distortion compensation coefficients $h[p(t),\Delta p]$ are stored in the distortion compensation coefficient table 22 in advance in correspondence with combinations of p(t) and $\Delta p$. If a transmit signal is generated by the transmit-signal generator 21 under these conditions, the S/P converter 31 converts the transmit signal to a quadrature signal composed of an in-phase signal component (I signal) and quadrature component signal (Q signal) and inputs the result to the address generator 23, distortion compensation application unit 24 and distortion compensation coefficient updating unit 25. The address generator 23 calculates the power value p(t) of the transmit signal from the quadrature signal, calculates the difference $\Delta p$ between the present power value and the power value that preceded it, generates the address A $[p(t),\Delta p]$, where p(t) is the high-order address and $\Delta p$ the low-order address, reads the distortion compensation coefficient $h_{n-1}[p(t),\Delta p]$ out of the distortion compensation coefficient table 22 and inputs this coefficient to the distortion compensation application unit 24. The latter applies distortion compensation processing to the quadrature signal by executing the calculation of Equation (1). The DA converter 32 converts each component of the distortion-compensated quadrature signal to an analog signal, the quadrature modulator 26 applies quadrature modulation to the distortion-compensated quadrature signal, and the transmission power amplifier 27 amplifies the quadrature-modulated signal and transmits the amplified signal from the antenna 28.

The demodulator (quadrature detector) 30 demodulates the output signal of the transmission power amplifier 27 that enters from the directional coupler 29, and the AD converter 33 converts the components of the demodulated signal to digital signals and inputs the digital signals to the distortion compensation coefficient updating unit 25. The latter updates the distortion compensation coefficient by adaptive signal processing in such a manner that the difference between the quadrature signal before distortion compensation and the demodulated signal becomes zero $\{h_{n-1}[p(t),\Delta p] \rightarrow h_n[p(t),\Delta p]\}$, and stores the distortion compensation coefficient $h_n[p(t),\Delta p]$ at the address A $[p(t),\Delta p]$ indicated by the delay circuit 23d. The above operation is then repeated so that the distortion compensation coefficient will converge to a constant value.

Figures 4, 5:
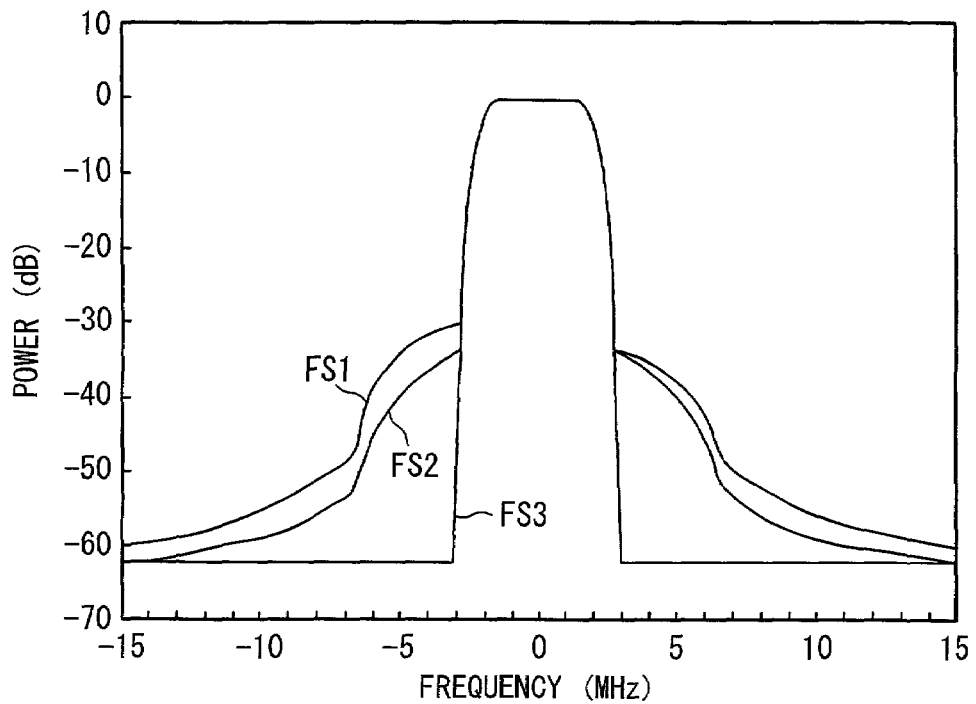
FIG. 4 is a frequency-spectrum characteristic diagram according to the present invention.
FIG. 5 is a characteristic chart of a transmit signal used in a simulation.

FIG. 4 shows the results of a simulation of a frequency spectrum FS3 according to this embodiment. Here side lobes are suppressed. FS1 shows a spectrum characteristic in a case where distortion compensation processing is not executed, and FS2 shows a spectrum characteristic in a case where conventional distortion compensation processing has been executed.

In the simulation, a 60-code (60-channel) multiplexed signal is used as the transmit signal, the peak value of the code-multiplexed signal is suppressed at 13.5 codes and the code-multiplexed signal is filtered by a route Nyquist filter the roll-off factor $\alpha$ of which is 0.22, as shown in FIG. 5, in order to observe the effects of linearization in a case where the apparatus is applied to a W-CDMA scheme. The chip frequency is 4.096 Mbps and the carrier rate is 64 kbps.

Figure 6:
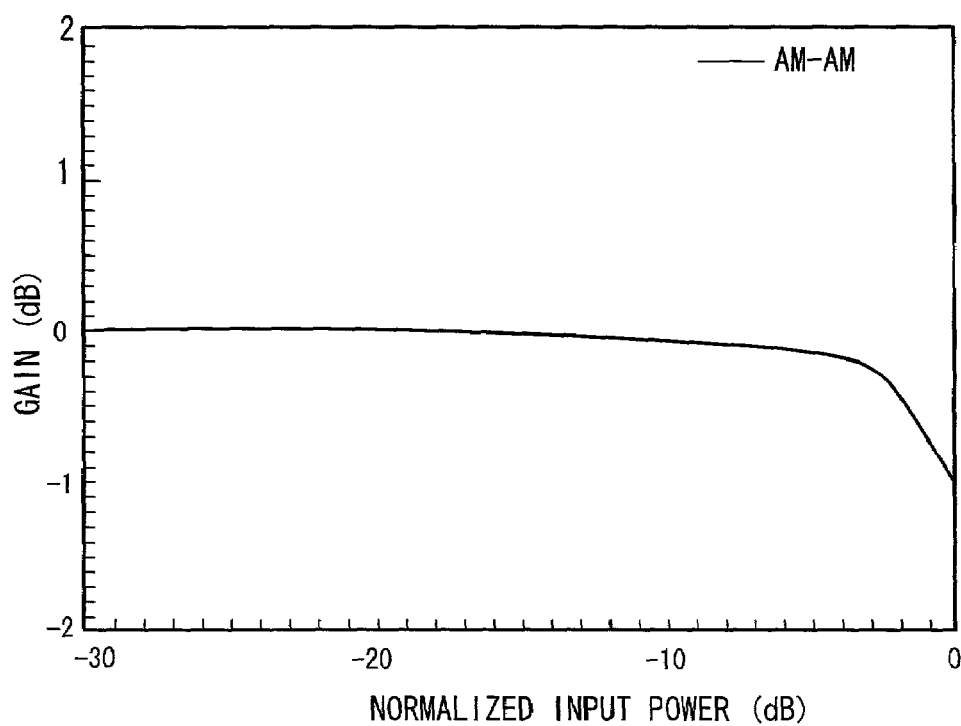
FIG. 6 shows an amplitude characteristic of an amplifier.
Figure 7:
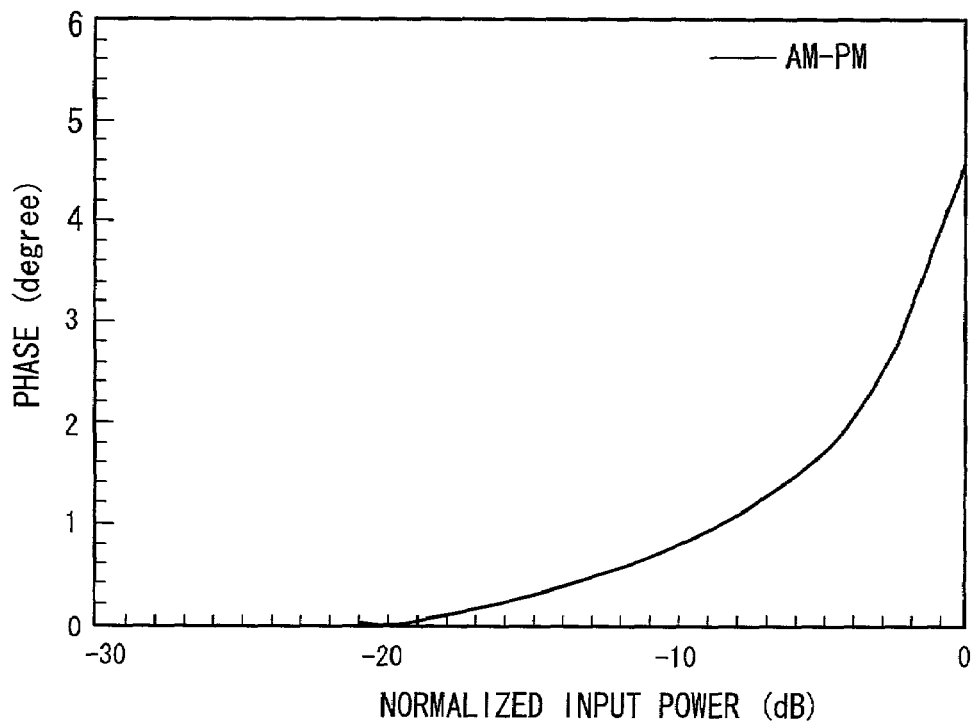
FIG. 7 shows a phase characteristic of the amplifier.
Figure 8:
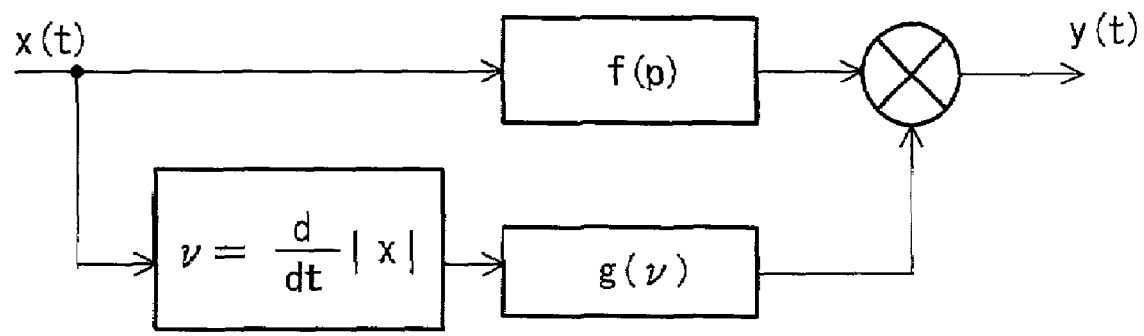
FIG. 8 shows a simulation table of the amplifier.

Further, the characteristic of normalized input power vs. gain of the amplifier used in the simulation is illustrated in FIG. 6, and the characteristic of normalized input power vs. phase of the amplifier is illustrated in FIG. 7. The amplifier starts to saturate from the vicinity of −6 dB, as will be understood from the characteristic of input power vs. gain. The model of this amplifier is depicted in FIG. 8. According to the model, a gain fluctuation function g(v) conforming to the time differential value v of an input envelope signal is introduced, and it is assumed that a signal y(t), which is obtained by multiplying, by g(v), an input signal x(t) that has undergone distortion f(p) (where p represents transmission power), is output from the amplifier. That is, the simulation is carried out assuming that amplifier distortion is dependent upon p $(=|x|^2)$, x'(t). The gain fluctuation function g(v) is given by the following equation, where r represents a gain fluctuation coefficient and is equal to 0.1:

$$g(v) = \begin{cases} 1+r & v < -1 \\ 1 - r\sin(\frac{\pi}{2}v) & |v| \leq 1 \\ 1-r & v > 1 \end{cases} \quad (2)$$

Figure 9:
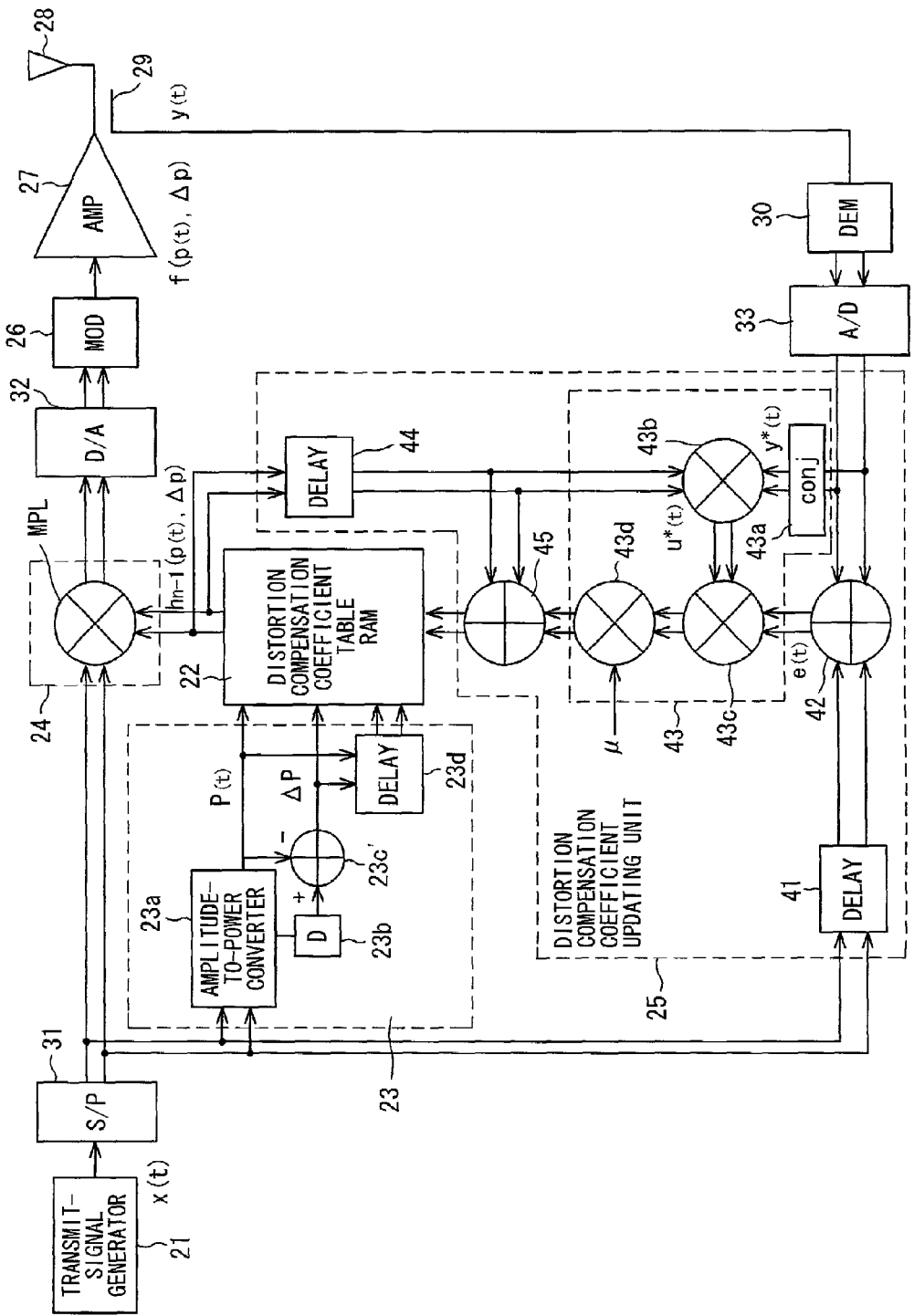
FIG. 9 shows an embodiment in which distortion compensation coefficients are updated in accordance with an LMS algorithm.

(a) Embodiment for case where distortion compensation coefficient is updated by LMS algorithm FIG. 9 shows an example in which the distortion compensation coefficient updating unit 25 of the first embodiment is implemented so as to update distortion compensation coefficients by adaptive signal processing based upon the LMS algorithm. Components in the embodiment of FIG. 9 identical with those of the first embodiment of FIG. 2 are designated by like reference characters. This embodiment differs in the following respects:

(1) The rotation calculation unit 43 of the distortion compensation coefficient updating unit 25 is constructed so as to update coefficients in accordance with the LMS algorithm.

(2) An arithmetic unit 23c' for calculating the difference Δp [=p(t)−p(t−Δt)] between the present power value and the power value that preceded it is provided instead of the DSP 23c of the address generator 23.

In the rotation calculation unit 43, a complex-conjugate signal output unit 43a outputs a complex-conjugate signal y*(t) of the demodulated signal y(t), a multiplier 43b performs multiplication between the distortion compensation coefficient $h_{n-1}[(p),\Delta p]$ and y*t) and outputs a complex-conjugate signal u*(t) of u(t), a multiplier 43c performs multiplication between the error signal e(t) and u*(t), and a multiplier 43d performs multiplication by a step-size parameter μ and outputs μe(t)u*(t).

The distortion compensation coefficient updating unit 25 updates the distortion compensation coefficient in accordance with the following LMS algorithm:

$$h_n[p(t),\Delta p]=h_{n-1}[p(t),\Delta p]+\mu \cdot e(t)u^*(t)$$

$$e(t)=x(t)-y(t)$$

$$u(t)=x(t)\cdot f[p(t),\Delta p]\approx h^*_{n-1}[p(t),\Delta p]\cdot y(t)$$

$$y(t)=h_{n-1}[p(t),\Delta p]\cdot x(t)\cdot f[p(t),\Delta p]$$

$$p(t)=|x(t)|^2$$

$$\Delta p=p(t-1)-p(t) \qquad (3)$$

where x, y, f, h, u and e are complex numbers.

More specifically, the distortion compensation coefficient is updated in accordance with Equation (3) and the updated distortion compensation coefficient $h_n[p(t),\Delta p]$ is stored in the distortion compensation coefficient table 22 instead of the distortion compensation coefficient $h_{n-1}[p(t),\Delta p]$ that prevailed prior to updating.

Figure 10:
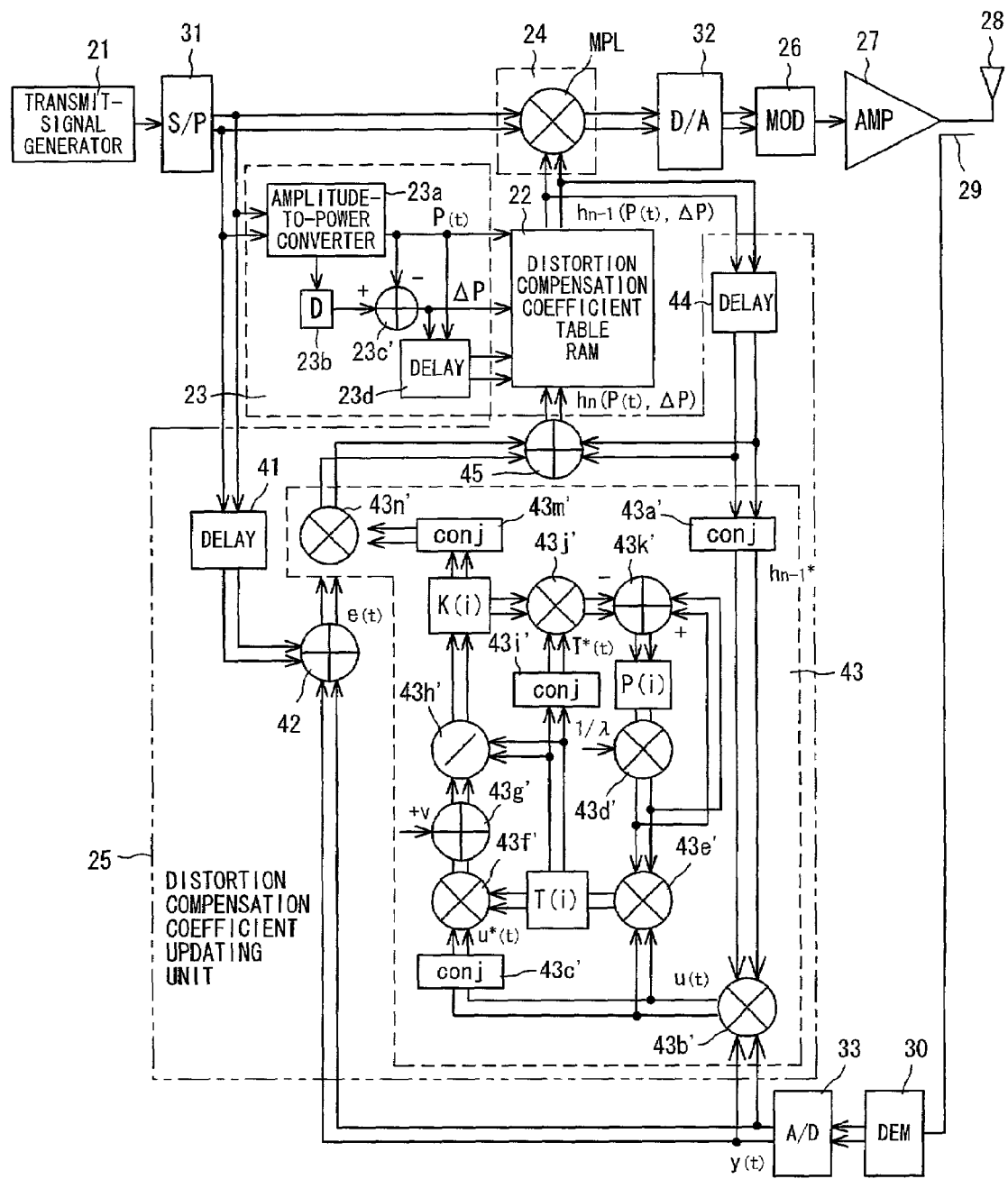
FIG. 10 shows an embodiment in which distortion compensation coefficients are updated in accordance with an RLS algorithm.

(b) Embodiment for case where distortion compensation coefficient is updated by RLS algorithm FIG. 10 shows an example in which the distortion compensation coefficient updating unit 25 of the first embodiment is implemented so as to update distortion compensation coefficients by adaptive signal processing based upon the RLS algorithm. Components in the embodiment of FIG. 10 identical with those of the first embodiment of FIG. 2 are designated by like reference characters. This embodiment differs in the following respects:

(1) The rotation calculation unit 43 of the distortion compensation coefficient updating unit is constructed so as to update coefficients in accordance with the RLS algorithm.

(2) The arithmetic unit 23c' for calculating the difference Δp [=p(t)−p(t−Δt)] between the present power value and the power value that preceded it is provided instead of the DSP 23c of the address generator 23.

In the rotation calculation unit 43, a complex-conjugate signal output unit 43a' outputs a complex-conjugate signal $h_{n-1}*[p(t),\Delta p]$ of the distortion compensation coefficient $h_{n-1}[p(t),\Delta p]$, a multiplier 43b' performs multiplication between the demodulated signal y(t) and the signal $h_{n-1}*[(p),\Delta p]$ and outputs u(t), a complex-conjugate signal output unit 43c' outputs a complex-conjugate signal u*(t) of u(t), a multiplier 43d' performs multiplication between P(t−1) and 1/λ, a multiplier 43e' performs the multiplication T(t)=λ$^{-1}$·P(t−1)·u(t), a multiplier 43f' performs the multiplication u*(t)·T(t−1) and outputs the product, an adder 43g' calculates [v+u*(t)·T(t)] and outputs the result, a divider 43h' calculates K(t)=T(t)/[v+u*(t)·T(t)], a complex-conjugate signal output unit 43i' outputs a complex-conjugate signal T*(t) of T(t), a multiplier 43j' calculates K(t)·T*(t) and outputs the result, an adder 43k' calculates P(t)=λ$^{-1}$·P(t−1)−K(t)·T*(t), a complex-conjugate signal output unit 43m' outputs a complex-conjugate signal K*(t) of K(t), and a multiplier 43n' calculates e(t)·K*(t) and outputs the result.

The distortion compensation coefficient updating unit 25 updates the distortion compensation coefficient in accordance with the following RLS algorithm:

$$h_n[p(t),\Delta p]=h_{n-1}[p(t),\Delta p]+e(t)\cdot K^*(t)$$

$$K(t)=T(t)/[v+u^*(t)\cdot T(t)]$$

$$P(t)=\lambda^{-1}\cdot P(t-1)-K(t)\cdot T^*(t)$$

$$T(t)=\lambda^{-1}\cdot P(t-1)\cdot u(t)$$

$$e(t)=x(t)-y(t)$$

$$u(t)=x(t)\cdot f[p(t),\Delta p]\approx h^*_{n-1}[p(t),\Delta p]\cdot y(t)$$

$$y(t)=h_{n-1}[p(t),\Delta p]\cdot x(t)\cdot f[p(t),\Delta p]$$

$$p(t)=|x(t)|^2$$

$$\Delta p=p(t-1)-p(t) \qquad (4)$$

where x, y, f, h, u, e, K, P and T are complex numbers.

More specifically, the distortion compensation coefficient is updated in accordance with Equation (4) and the updated distortion compensation coefficient $h_n[p(t),\Delta p]$ is stored in the distortion compensation coefficient table 22 instead of the distortion compensation coefficient $h_{n-1}[p(t),\Delta p]$ that prevailed prior to updating. The RLS algorithm has a convergence characteristic superior to that of the LMS algorithm and makes it possible to achieve convergence of the distortion compensation coefficient at high speed.

(c) First Modification

Figure 11:
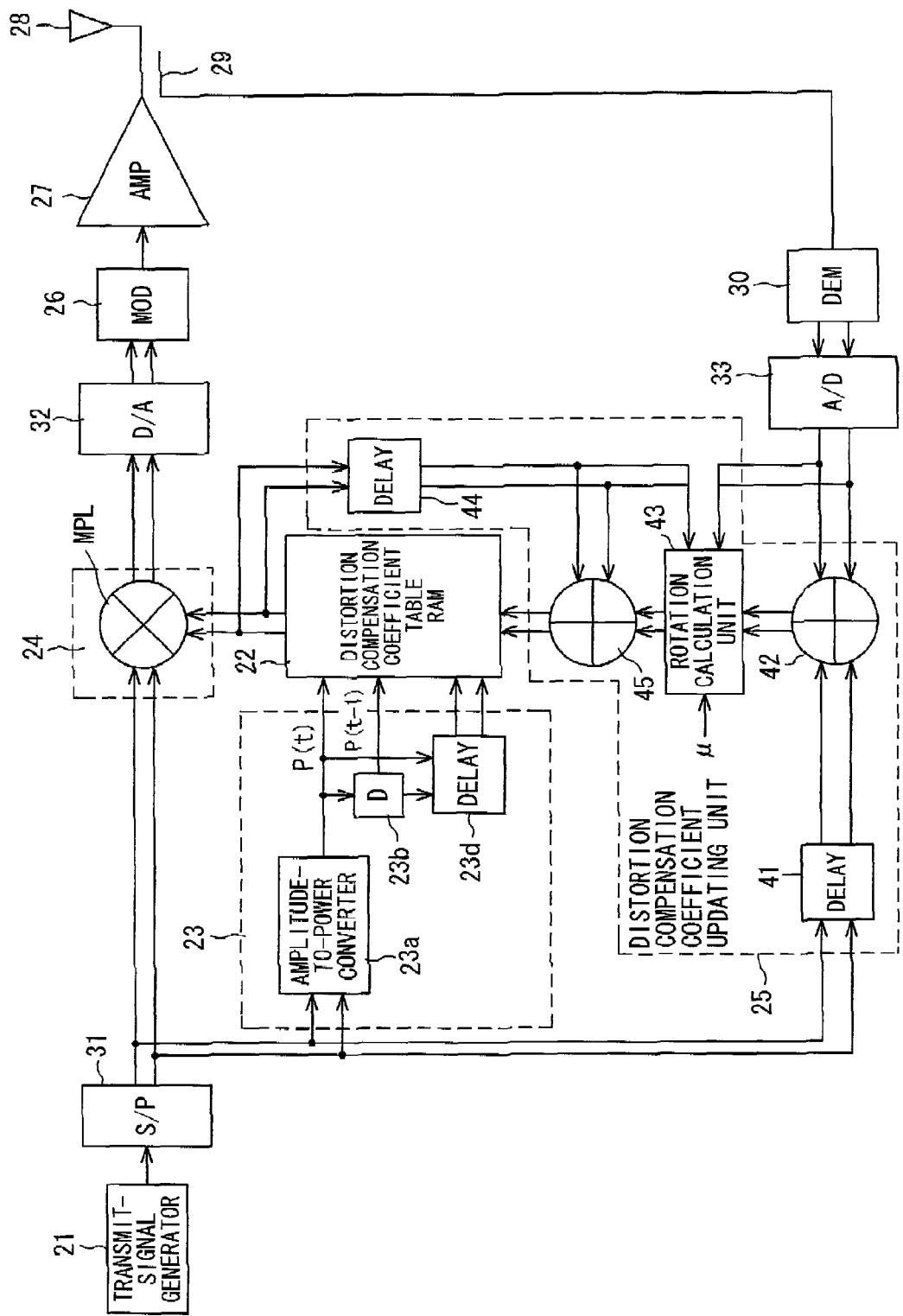
FIG. 11 shows a first modification of the first embodiment.

In the first embodiment, it is assumed that a distortion compensation coefficient is a function of p(t), Δp, and the distortion compensation coefficient is stored in the distortion compensation coefficient table 22 at an address A [p(t),Δp] corresponding to p(t), Δp. However, an arrangement can be adopted in which it is assumed that a distortion compensation coefficient is a function of p(t), P(t−1), and the distortion compensation coefficient is stored in the distortion compensation coefficient table 22 at an address A [p(t),p(t−1)] corresponding to P(t), P(t−1). FIG. 11 is a diagram showing the structure of this first modification. This modification differs from the first embodiment of FIG. 2 in the following respects:

(1) The DSP 23c is eliminated from the address generator 23, the latter generates the address A [p(t),p(t−1)] in which p(t) is the high-order address and p(t−1) the low-order address, and the delay circuit 23d generates the address A [p(t),p(t−1)] after a predetermined time Δt.

(2) The distortion compensation coefficient table 22 is constructed as shown in FIG. 12 and distortion compensation coefficients h[p(t),p(t−1)] are stored at addresses A [p(t),p(t−1)] conforming to present and preceding power values P(t), P(t−1).

Initial values of distortion compensation coefficients h[p(t),p(t−1)] are stored in the distortion compensation coefficient table 22 in advance in correspondence with combinations of p(t) and p(t−1). If a transmit signal is generated by the transmit-signal generator 21 under these conditions, the S/P converter 31 converts the transmit signal to a quadrature signal composed of an in-phase signal component (I signal) and quadrature component signal (Q signal) and inputs the result to the address generator 23, distortion compensation application unit 24 and distortion compensation coefficient updating unit 25. The address generator 23 calculates the power value p(t) of the transmit signal from the quadrature signal, generates the address A [p(t),p(t−1)], where p(t) is the high-order address and the power p(t−1) preceding it is the low-order address, reads the distortion compensation coefficient $h_{n-1}[p(t),p(t-1)]$ out of the distortion compensation coefficient table 22 and inputs this coefficient to the distortion compensation application unit 24. The latter applies distortion compensation processing to the quadrature signal by executing the calculation of Equation (1). The DA converter 32 converts each component of the distortion-compensated quadrature signal to an analog signal, the quadrature modulator 26 applies quadrature modulation to the distortion-compensated quadrature signal, and the transmission power amplifier 27 amplifies the quadrature-modulated signal and transmits the amplified signal from the antenna 28.

The demodulator (quadrature detector) 30 demodulates the output signal of the transmission power amplifier 27 that enters from the directional coupler 29, and the AD converter 33 converts the components of the demodulated signal to digital signals and inputs the digital signals to the distortion compensation coefficient updating unit 25. The latter updates the distortion compensation coefficient by adaptive signal processing in such a manner that the difference between the quadrature signal before distortion compensation and the demodulated signal becomes zero $\{h_{n-1}[p(t),p(t-1)]\rightarrow h_n[p(t),p(t-1)]\}$, and stores the distortion compensation coefficient $h_n[p(t),p(t-1)]$ at the address A [p(t),p(t−1)] indicated by the delay circuit 23d. The above operation is then repeated so that the distortion compensation coefficient will converge to a constant value.

(c) Second Modification

Figure 13:
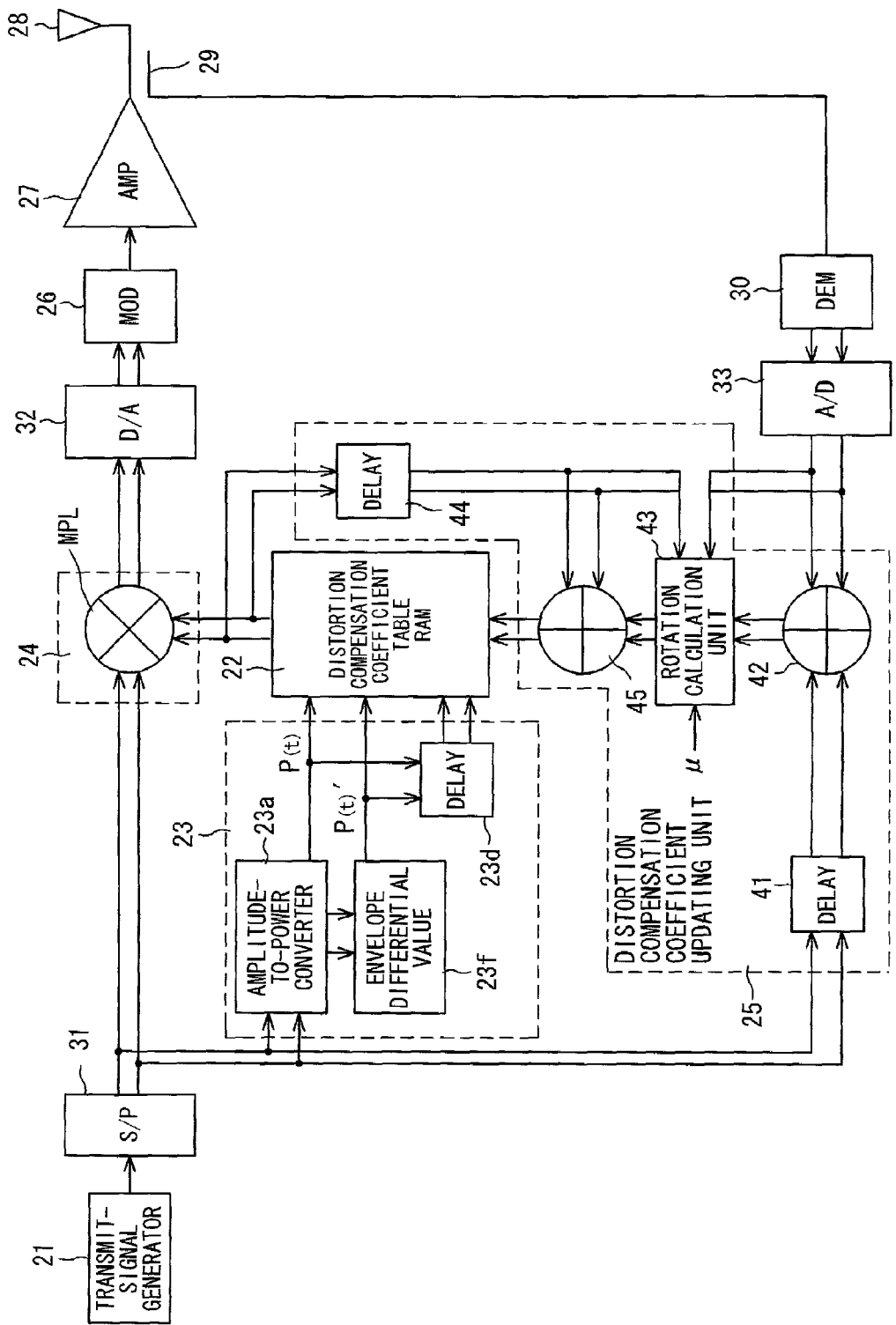
FIG. 13 shows a second modification of the first embodiment.

In the first embodiment, it is assumed that a distortion compensation coefficient is a function of p(t), Δp, and the distortion compensation coefficient is stored at an address A [p(t),Δp] corresponding to p(t), Δp in the distortion compensation coefficient table 22. However, an arrangement can be adopted in which it is assumed that a distortion compensation coefficient is a function of power p(t) and a differential value p(t)' of the envelope thereof, and the distortion compensation coefficient is stored in the distortion compensation coefficient table 22 at an address A [p(t),p(t)'] corresponding to P(t), P(t)'. FIG. 13 is a diagram showing the structure of this second modification. This modification differs from the first embodiment of FIG. 2 in the following respects:

(1) The address generator 23 is provided with an arithmetic unit (implemented by a DSP) for calculating the differential value of the envelope, the latter generates the address A [p(t),p(t)'] in which the power value p(t) of the present transmit signal is the high-order address and the differential value p(t)' is the low-order address, and the delay circuit 23d generates the address A [p(t),p(t)'] after a predetermined time Δt.

(2) Distortion compensation coefficients h[p(t),p(t)'] are stored in the distortion compensation coefficient table 22 at addresses A [p(t),p(t)'] conforming to the present power value P(t) and the differential value p(t)'.

Initial values of distortion compensation coefficients h[p(t),p(t)'] are stored in the distortion compensation coefficient table 22 in advance in correspondence with combinations of p(t) and p(t)'. If a transmit signal is generated by the transmit-signal generator 21 under these conditions, the S/P converter 31 converts the transmit signal to a quadrature signal composed of an in-phase signal component (I signal) and quadrature component signal (Q signal) and inputs the result to the address generator 23, distortion compensation application unit 24 and distortion compensation coefficient updating unit 25. The address generator 23 calculates the power value p(t) of the transmit signal from the quadrature signal, generates the address A [p(t), p(t)'], where p(t) is the high-order address and the differential value power p(t)' of the envelope of the transmission power is the low-order address, reads the distortion compensation coefficient $h_{n-1}$ [p(t), p(t)'] out of the distortion compensation coefficient table 22 and inputs this coefficient to the distortion compensation application unit 24. The latter applies distortion compensation processing to the quadrature signal by executing the calculation of Equation (1). The DA converter 32 converts each component of the distortion-compensated quadrature signal to an analog signal, the quadrature modulator 26 applies quadrature modulation to the distortion-compensated quadrature signal, and the transmission power amplifier 27 amplifies the quadrature-modulated signal and transmits the amplified signal from the antenna 28. The demodulator (quadrature detector) 30 demodulates the output signal of the transmission power amplifier 27 that enters from the directional coupler 29, and the AD converter 33 converts the components of the demodulated signal to digital signals and inputs the digital signals to the distortion compensation coefficient updating unit 25. The latter updates the distortion compensation coefficient by adaptive signal processing in such a manner that the difference between the quadrature signal before distortion compensation and the demodulated signal becomes zero $\{h_{n-1}[p(t),p(t)']\rightarrow h_n[p(t),p(t)']\}$, and stores the distortion compensation coefficient $h_n[p(t), p(t)']$ at the address indicated by the delay circuit 23d.

(e) Third Modification

Figure 14:
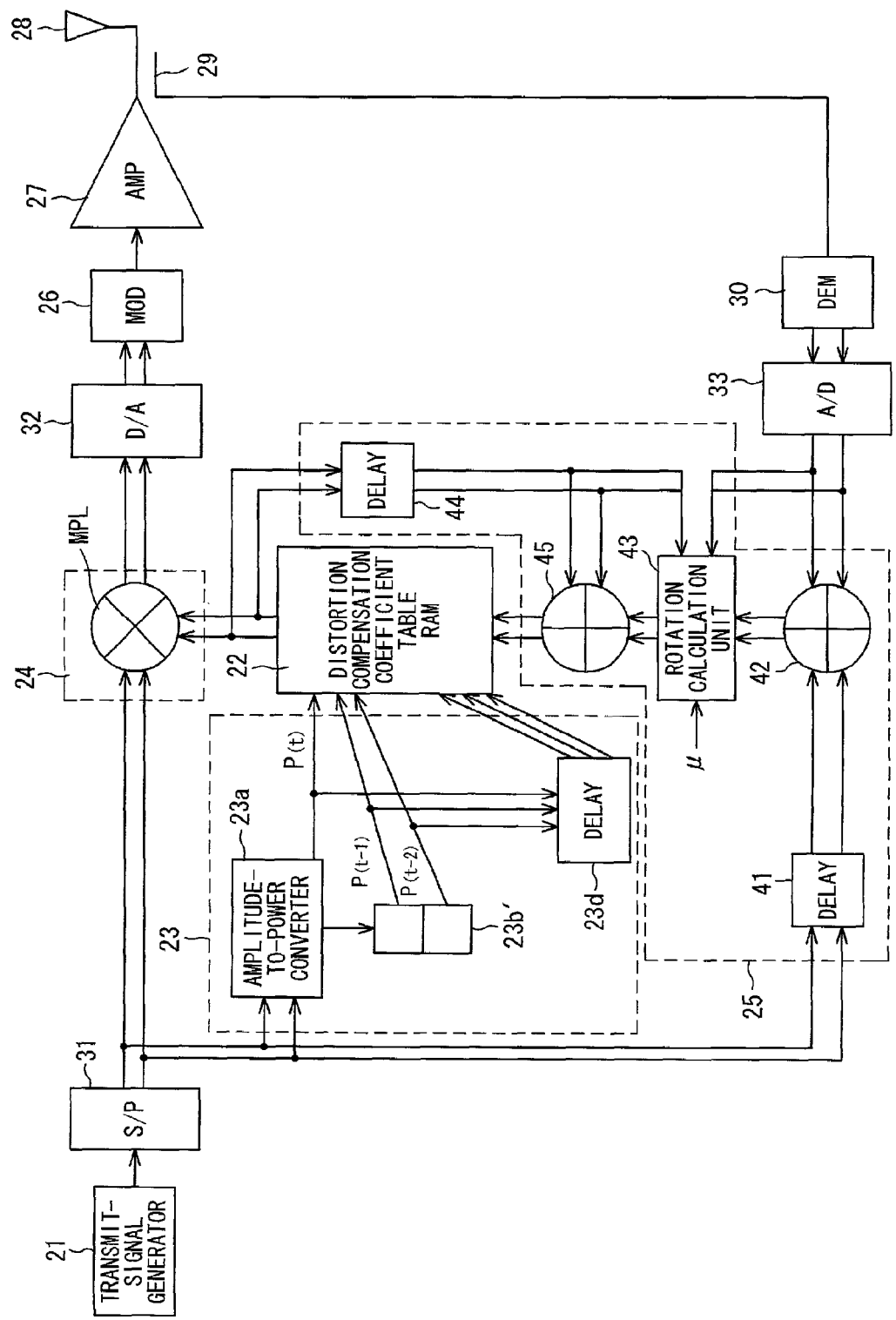
FIG. 14 shows a third modification of the first embodiment.

In the first embodiment, a distortion compensation coefficient is decided based upon present power value and the power value that preceded it. However, a distortion compensation coefficient can be decided based upon the power value of the present transmit signal and the power values of a plurality of past transmit signals, such as the present power value and the two power values that preceded it. FIG. 14 is a diagram showing the structure of the third modification. This modification differs from the first embodiment of FIG. 2 in the following respects:

(1) The DSP 23c is eliminated from the address generator 23, a delay circuit 23b' for storing the preceding power value p(t−1) and the power value p(t−2) that preceded it is provided instead, the latter generates the address A [p(t),p(t−1)p(t−2)] in which p(t) is the high-order address, p(t−1) the medium-order address and p(t−2) the low-order address, and the delay circuit 23d generates the address A [p(t),p(t−1),p(t−2)] after a predetermined time Δt.

(2) The distortion compensation coefficient table 22 is constructed as shown in FIG. 15 and distortion compensation coefficients h[p(t),p(t−1),p(t−2)] are stored at addresses A [p(t),p(t−1),p(t−2)] conforming to present, last and before-last power values P(t), P(t−1) and p(t−2).

Other Structure of Third Modification

Figure 16:
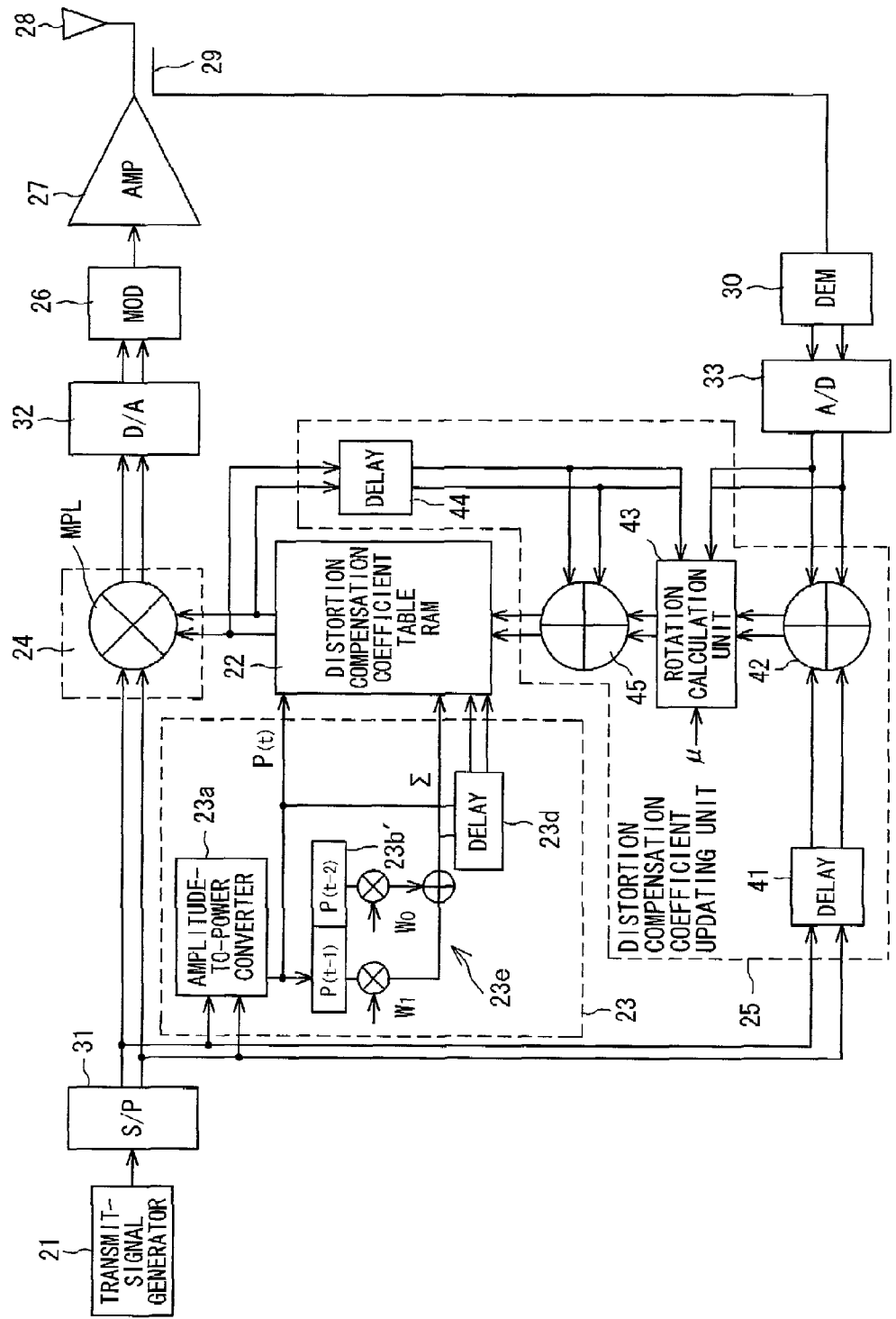
FIG. 16 shows another structure of the third modification.

FIG. 16 is a diagram showing another structure of the third modification. This modification differs from the first embodiment of FIG. 2 in the following respects:

(1) The address generator 23 is provided with a delay circuit 23b' for storing the preceding power value p(t−1) and the power value p(t−2) that preceded it, and with an arithmetic unit 23e for weighting the power values p(t−1), p(t−2) and combining them [Σ=$w_o$p(t−1)+$w_1$p(t−2)].

(2) Address A [p(t),Σ], in which the present power value p(t) is the high-order address and the combined value is the low-order address, is generated, and address A [p(t),Σ] is generated by the delay circuit 23d after a predetermined time Δt.

(3) Distortion compensation coefficients h[p(t), Σ] are stored in the distortion compensation coefficient table 22 at addresses A [p(t),Σ] conforming to the present power value P(t) and the combined value Σ.

Other Structure of Third Modification

Figure 17:
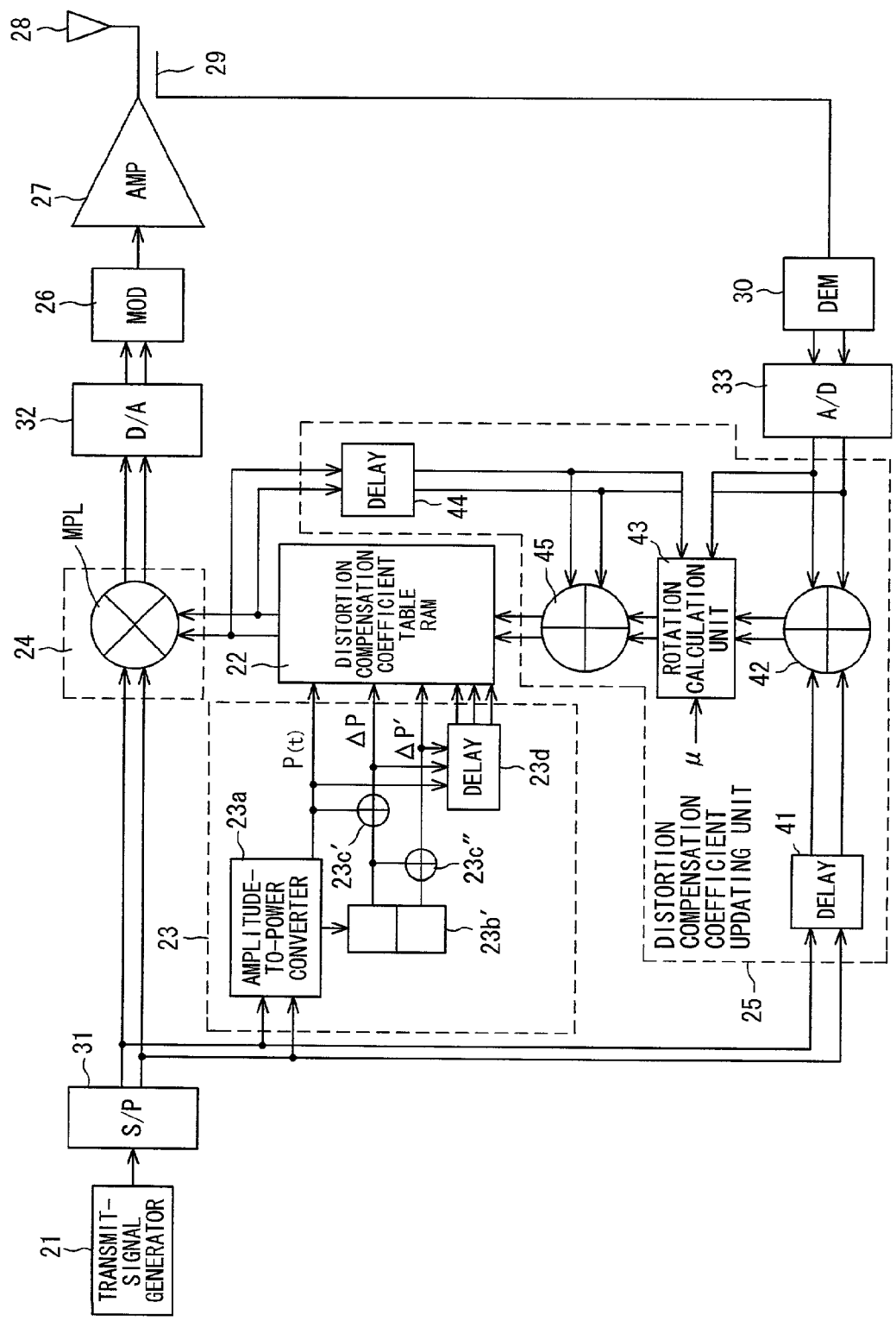
FIG. 17 shows a further structure of the third modification.

FIG. 17 is a diagram showing another structure of the third modification. This modification differs from the first embodiment of FIG. 2 in the following respects:

(1) The DSP 23c is eliminated from the address generator 23 and the latter is instead provided with the delay circuit 23b' for storing the preceding power value p(t−1) and the power value p(t−2) that preceded it, the arithmetic unit 23c' for calculating the difference Δp between the present power value and the power value that preceded it, and an arithmetic unit 23c" for obtaining the difference Δp' between the two preceding power values.

(2) Address A [p(t),Δp,Δp'], in which p(t) is the high-order address, Δp the medium-order address and Δp' the low-order address, is generated, and address A [p(t),p(t−1)] is generated by the delay circuit 23d after a predetermined time Δt.

(3) The distortion compensation coefficient table 22 is constructed as shown in FIG. 18 and distortion compensation coefficients h[p(t),Δp,Δp'] are stored at addresses A [p(t),Δp,Δp'] conforming to p(t), Δp, Δp'.

(C) Second Embodiment

Figure 19:
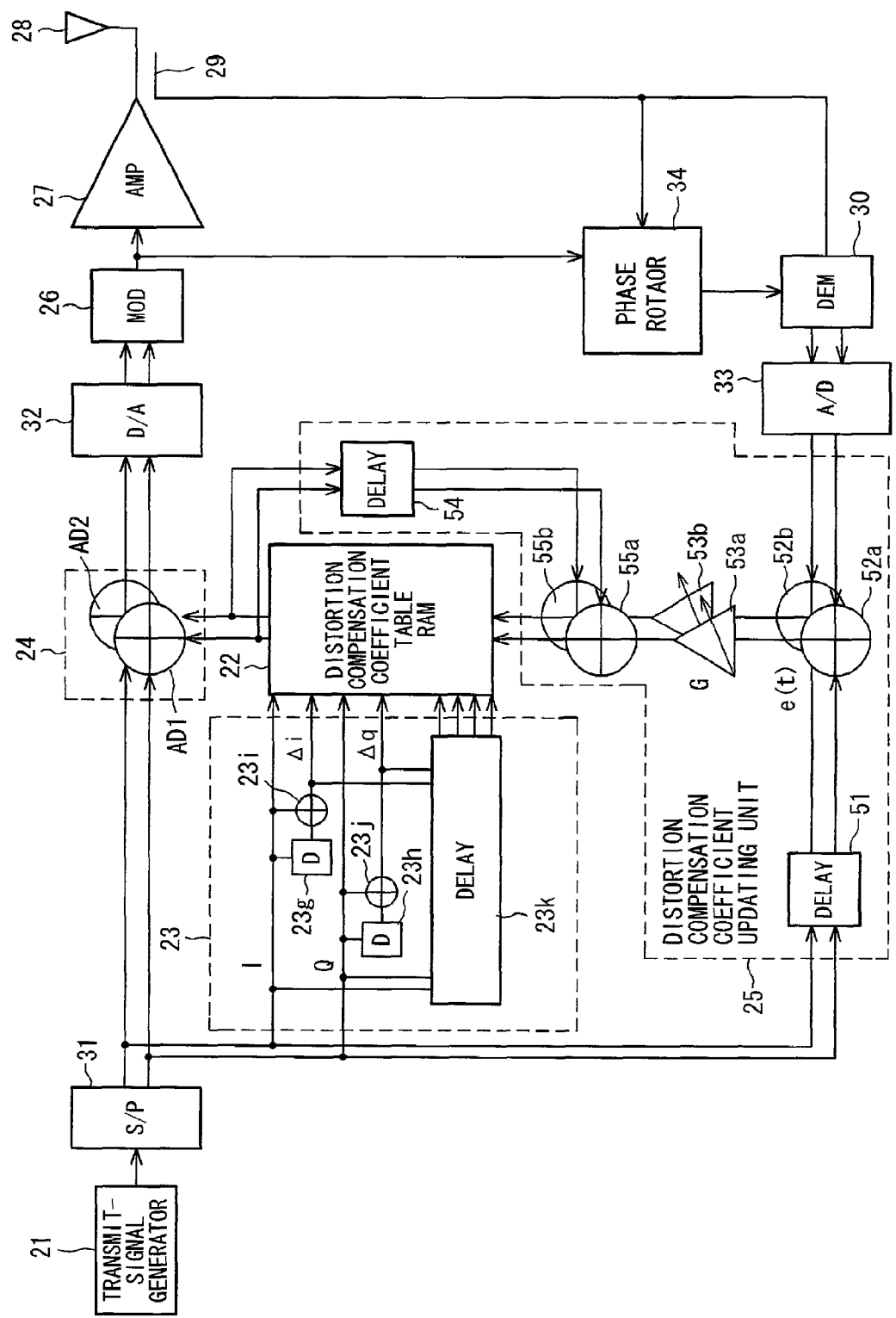
FIG. 19 is a diagram showing the structure of a second embodiment of the present invention.

FIG. 19 is a diagram showing the structure of a second embodiment of the present invention. This is an example in which a distortion compensation scheme (Cartesian-loop scheme) in a rectangular coordinate system is adopted as the distortion compensation scheme. Components identical with those shown in FIG. 1 are designated by like reference characters. The second embodiment is an example in which a distortion compensation coefficient is found as a function of amplitude of the present transmit signal and the difference between the amplitudes of the present transmit signal and of the transmit signal that preceded it.

Numeral 31 denotes the serial/parallel (S/P) converter 2 for dividing serial data, which is output from the transmit-signal generator 21, alternately one bit at a time to convert the data to two sequences, namely an in-phase component signal (I signal) and a quadrature component signal (Q signal). Numeral 32 denotes the DA converter for converting, to analog signals, the distortion-compensated quadrature signals (I and Q signals) output from the distortion compensation application unit 24. Numeral 33 denotes the AD converter for converting, to digital signals, quadrature-demodulated signals (I' and Q' signals) output from the demodulator 30. Numeral 34 denotes a phase rotator, to which the output of the quadrature modulator 26 and the output of the transmission power amplifier 27 are input, for eliminating phase rotation produced by the amplifier. The quadrature detector 30 demodulates and outputs the signal from which phase rotation has been eliminated.

The distortion compensation coefficient table 22 has tables corresponding to the real and imaginary parts of a distortion compensation coefficient. Assume that I(t), Q(t) represent the amplitudes of the in-phase and quadrature components of the present transmit signal, I(t−1), Q(t−1) the amplitudes of the in-phase and quadrature components of the preceding transmit signal, and Δi [=I(t)−I(t−1)],Δq [=Q(t)−Q(t−1)] the differences between these amplitudes. The real part hi[I(t),Δi] of a distortion compensation coefficient has been stored in the real-part table in correspondence with a combination of I(t) and Δi, as shown in FIG. 20(a), and the imaginary part hq[Q(t),Δq] of the distortion compensation coefficient has been stored in the imaginary-part table in correspondence with a combination of Q(t) and Δq, as shown in FIG. 20(b).

In the address generator 23, delay circuits 23g, 23h respectively output amplitudes I(t−1), Q(t−1) that prevailed a time Δt earlier, an arithmetic unit 23i performs the calculation Δi=I(t−1)−I(t), an arithmetic unit 23j performs the calculation Δq=Q(t−1)−Q(t), and a delay circuit 23k delays I(t), Q(t), Δi, Δq by the predetermined time Δt. Here I(t), Δi become the high-order and low-order addresses of an address Ai [I(t),Δi] of the real-part table, and Q(t), Δq become the high-order and low-order addresses of an address Δq [Q(t),Δq] of the imaginary-part table.

The distortion compensation application unit 24, which has two adders AD1, AD2 for the in-phase and quadrature components, adds the components I(t), Q(t) of the quadrature signal and distortion compensation coefficients hi[I(t),Δi], hq[Q(t),Δq], which have been read from the addresses Ai [I(t),Δi], Aq [Q(t),Δq], thereby applying distortion compensation to each component of the quadrature signal. In other words, the distortion compensation application unit 24 outputs the following:

$$I(t)+hi[I(t),\Delta i],\ Q(t)+hq[Q(t),\Delta q] \quad (5)$$

The distortion compensation coefficient updating unit 25 updates distortion compensation coefficients $hi_{n-1}$[I(t),Δi], $hq_{n-1}$[Q(t),Δq], which have been read from the addresses Ai [I(t),Δi], Aq [Q(t),Δq], in such a manner that the difference between the quadrature signal before compensation and the demodulated signal output from the demodulator (quadrature detector) 30 will become zero {$hi_{n-1}$[I(t),Δi]→$hi_n$[I(t),Δi], $hq_{n-1}$[Q(t),Δq]→$hq_n$[Q(t),Δq]}and stores the updated distortion compensation coefficients $hi_n$[I(t),Δi], $hq_n$[Q(t),Δq] at the original addresses Ai [I(t),Δi], Aq [Q(t),Δq].

More specifically, in the distortion compensation coefficient updating unit 25, a delay circuit 51 delays the quadrature signal, which is output from the S/P converter 31, for a predetermined period of time, subtractors 52a, 52b output an error ei(t) [=I(t)−I(t)'] and an error eq(t) [=Q(t)−Q(t)'] between the in-phase components and quadrature components of the quadrature signal x(t)=[I(t)+jQ(t)] and feedback demodulated signal y(t)=[I(t)'+jQ(t)'], multipliers 53a, 53b multiply each of the error signals by a constant G, a delay circuit 54 delays the distortion compensation coefficients $hi_{n-1}$[I(t),Δi], $hq_{n-1}$[Q(t),Δq] for a predetermined period of time, adders 55a, 55b perform the operations indicated by the following equations to thereby update the distortion compensation coefficients:

$$hi_n[I(t),\Delta i]=G\cdot ei(t)+hi_{n-1}[I(t),\Delta i] \quad (6)$$

$$hq_n[Q(t),\Delta q]=G\cdot eq(t)+hq_{n-1}[Q(t),\Delta q] \quad (7)$$

and stores the updated distortion compensation coefficients $hi_n$[I(t),Δi], $hq_n$[Q(t),Δq] at the original addresses Ai [I(t),Δi], Aq [Q(t),Δq].

To describe overall processing, initial values of a real parts hi[I(t),Δi] and imaginary parts hq[Q(t),Δq] of distortion compensation coefficients are stored in the real-part table and imaginary-part table of the distortion compensation coefficient table 22 in advance in correspondence with combinations of I(t) and Δi and combinations of Q(t) and Δq.

If a transmit signal is generated by the transmit-signal generator 21 under these conditions, the S/P converter 31 converts the transmit signal to a quadrature signal composed of an in-phase signal component (I signal) and quadrature component signal (Q signal) and inputs the result to the address generator 23, distortion compensation application unit 24 and distortion compensation coefficient updating unit 25. The address generator 23 generates addresses Ai [I(t), Δi], Aq [Q(t),Δq] of the real-part table and imaginary-part table of distortion compensation coefficient table 22 from the quadrature signal, reads distortion compensation coefficients $hi_{n-1}$[I(t),Δi], $hq_{n-1}$[Q(t),Δq] from the tables and inputs these coefficients to the distortion compensation application unit 24. The latter applies distortion compensation processing to the quadrature signal by executing the calculation of Equation (5). The DA converter 32 converts each component of the distortion-compensated quadrature signal to an analog signal, the quadrature modulator 26 applies quadrature modulation to the distortion-compensated quadrature signal, and the transmission power amplifier 27 amplifies the quadrature-modulated signal and transmits the amplified signal from the antenna 28.

The phase rotator 34 eliminates phase rotation, which has been produced by the transmission power amplifier 27, from the output signal of this amplifier, the quadrature detector 30 demodulates the signal from which phase rotation has been eliminated, and the AD converter 33 converts the components of the demodulated signal to digital signals and inputs the digital signals to the distortion compensation coefficient updating unit 25. The latter updates the distortion compensation coefficient in such a manner that the differences between the components of the quadrature signal before distortion compensation and of the demodulated signal become zero and stores the updated distortion compensation coefficients $hi_n$[I(t),Δi], $hq_n$[Q(t),Δq] at the original addresses Ai [I(t),Δi], Aq [Q(t),Δq]. The above operation is then repeated so that the distortion compensation coefficient will converge to a constant value.

In the foregoing, when the in-phase component of a distortion compensation coefficient is a function of I(t), Δi, the quadrature component is made a function of Q(t), Δq, the real-number part of the distortion compensation coefficient is stored at an address corresponding to I(t), Δi of the real-part table and the imaginary-number part of the distortion compensation coefficient is stored at an address corresponding to Q(t), Δq of the imaginary-part table. However, an arrangement can be adopted in which the in-phase component of the distortion compensation coefficient is made a function of I(t), I(t−1), the quadrature component is made a function of Q(t), Q(t−1), the real-number part of the distortion compensation coefficient is stored at an address corresponding to I(t), I(t−1) of the real-part table and the imaginary-number part of the distortion compensation coefficient is stored at an address corresponding to Q(t), Q(t−1) of the imaginary-part table.

(a) First Modification of the Second Embodiment

Figure 21:
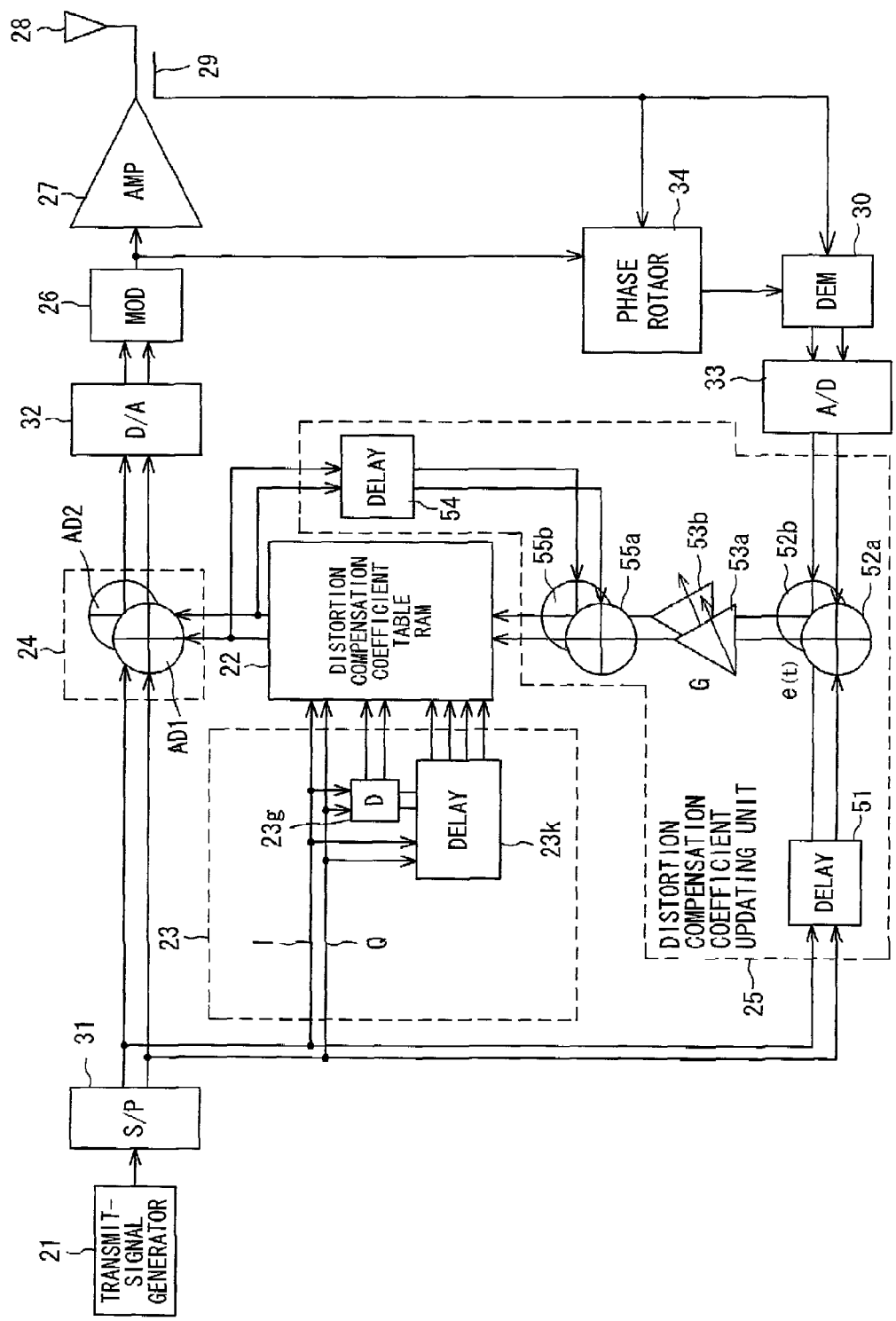
FIG. 21 shows a first modification of the second embodiment.
Figure 22:
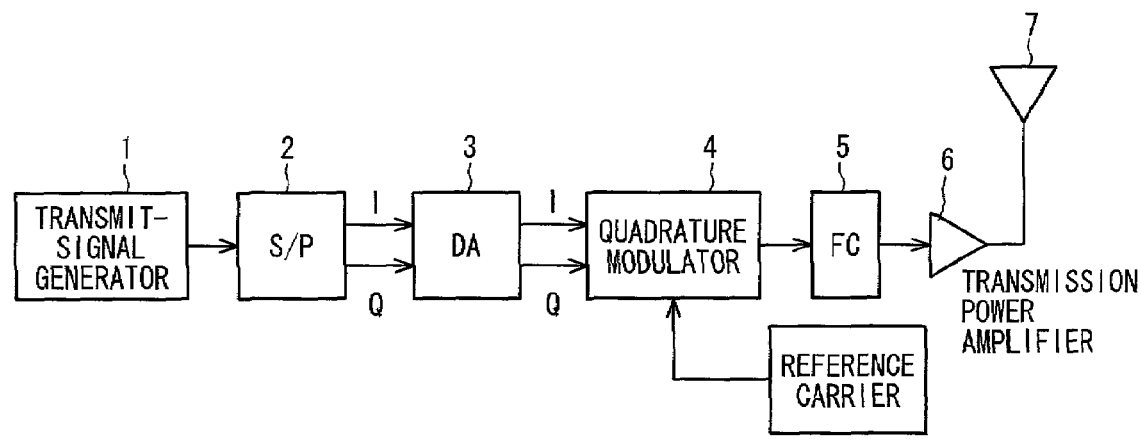
FIG. 22 is a diagram showing the structure of a transmitting apparatus according to the prior art.
Figure 23:
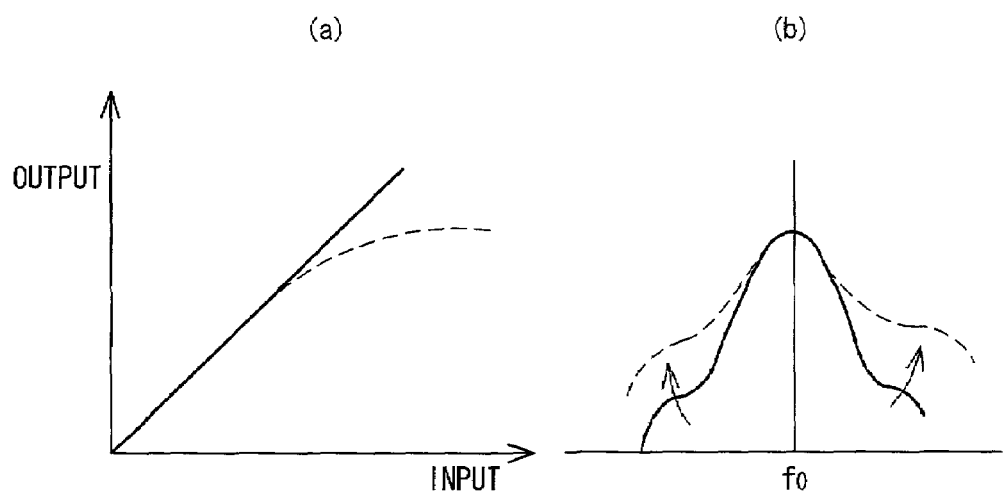
FIG. 23 is a diagram useful in describing a problem caused by non-linearity of a transmission power amplifier.
Figure 24:
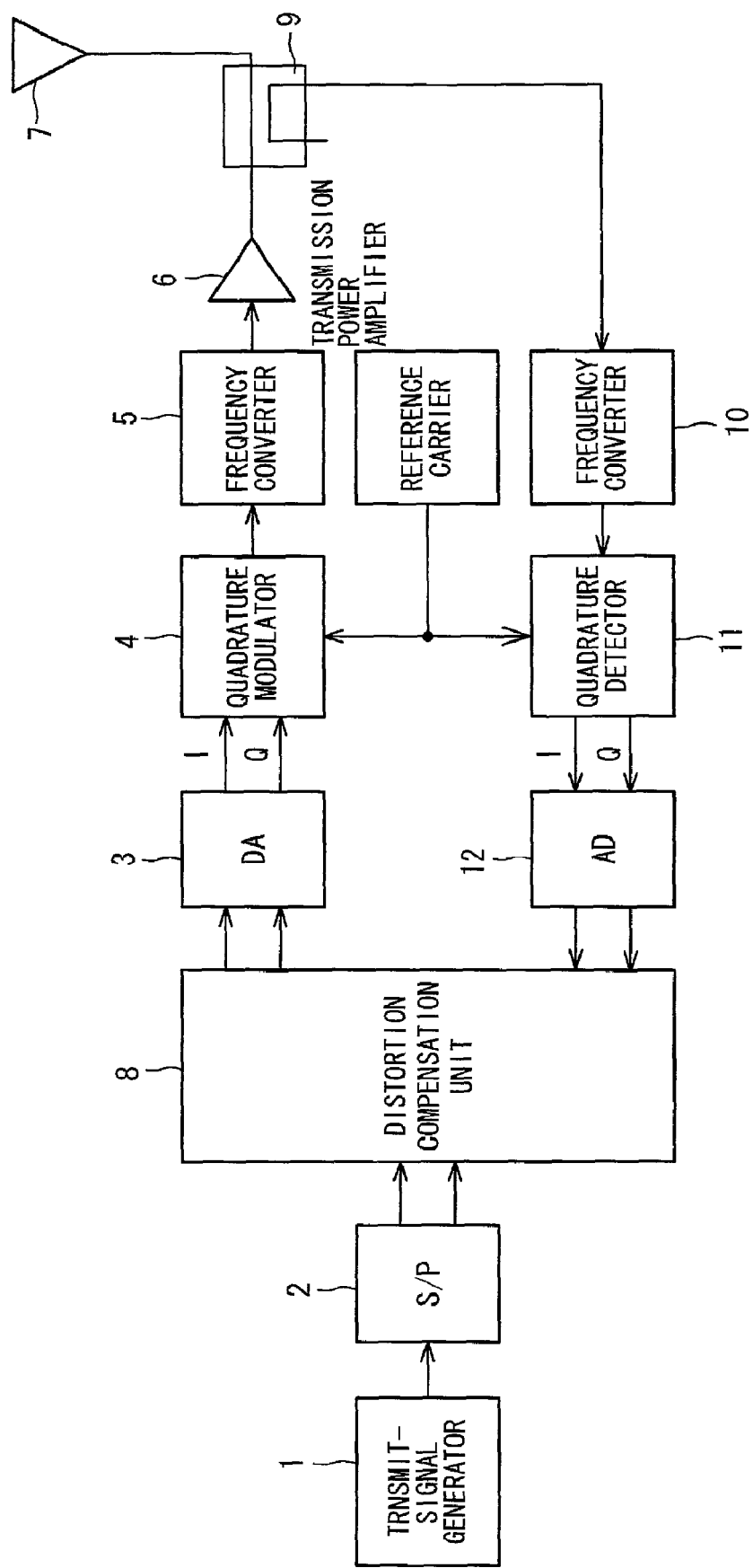
FIG. 24 is a diagram showing the structure of a transmitting apparatus having a digital non-linear distortion compensation function according to the prior art.
Figure 25:
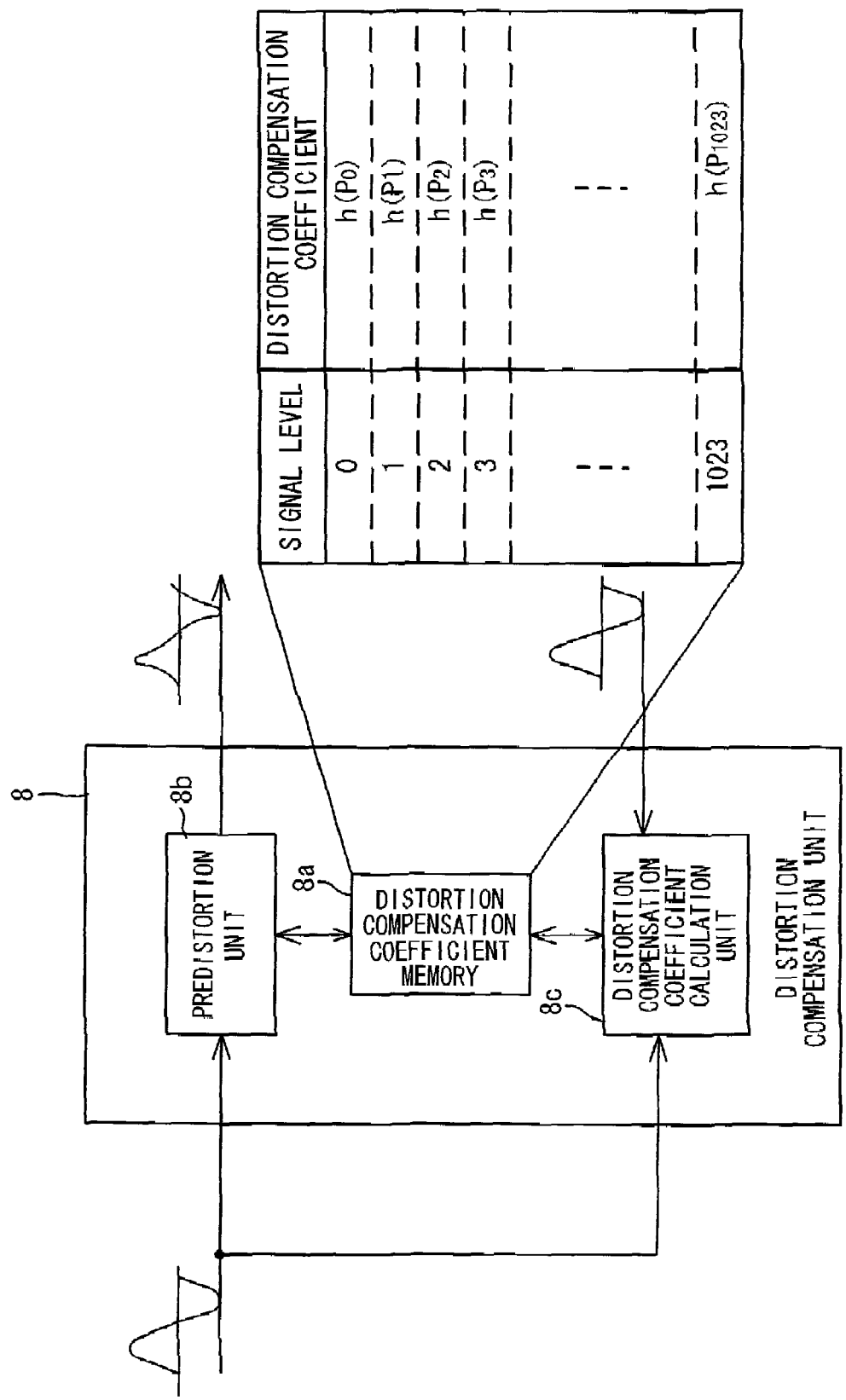
FIG. 25 is a diagram illustrating the function of a distortion compensator.
Figure 26:
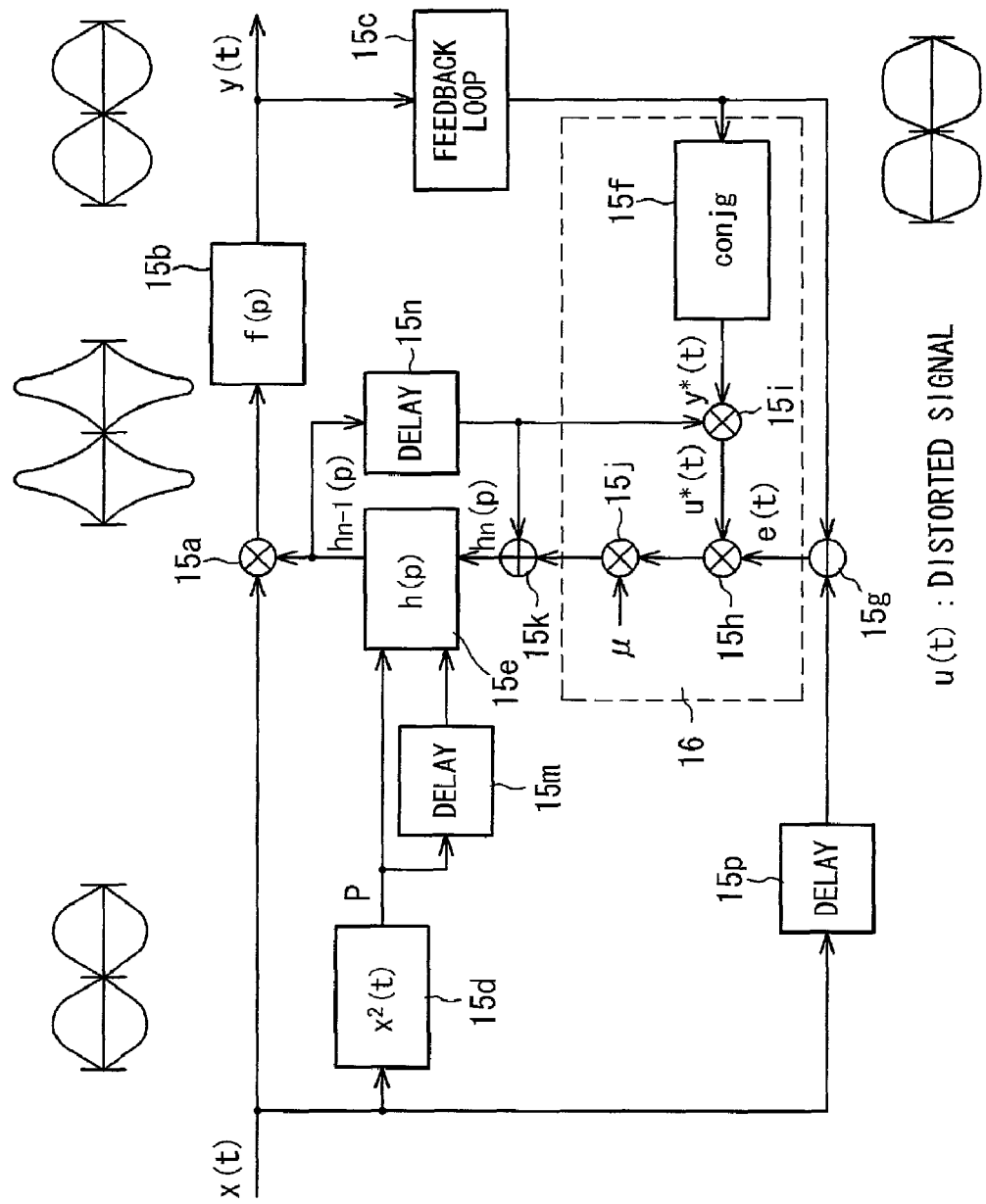
FIG. 26 is a diagram useful in describing the distortion compensation processing.
Figure 27:
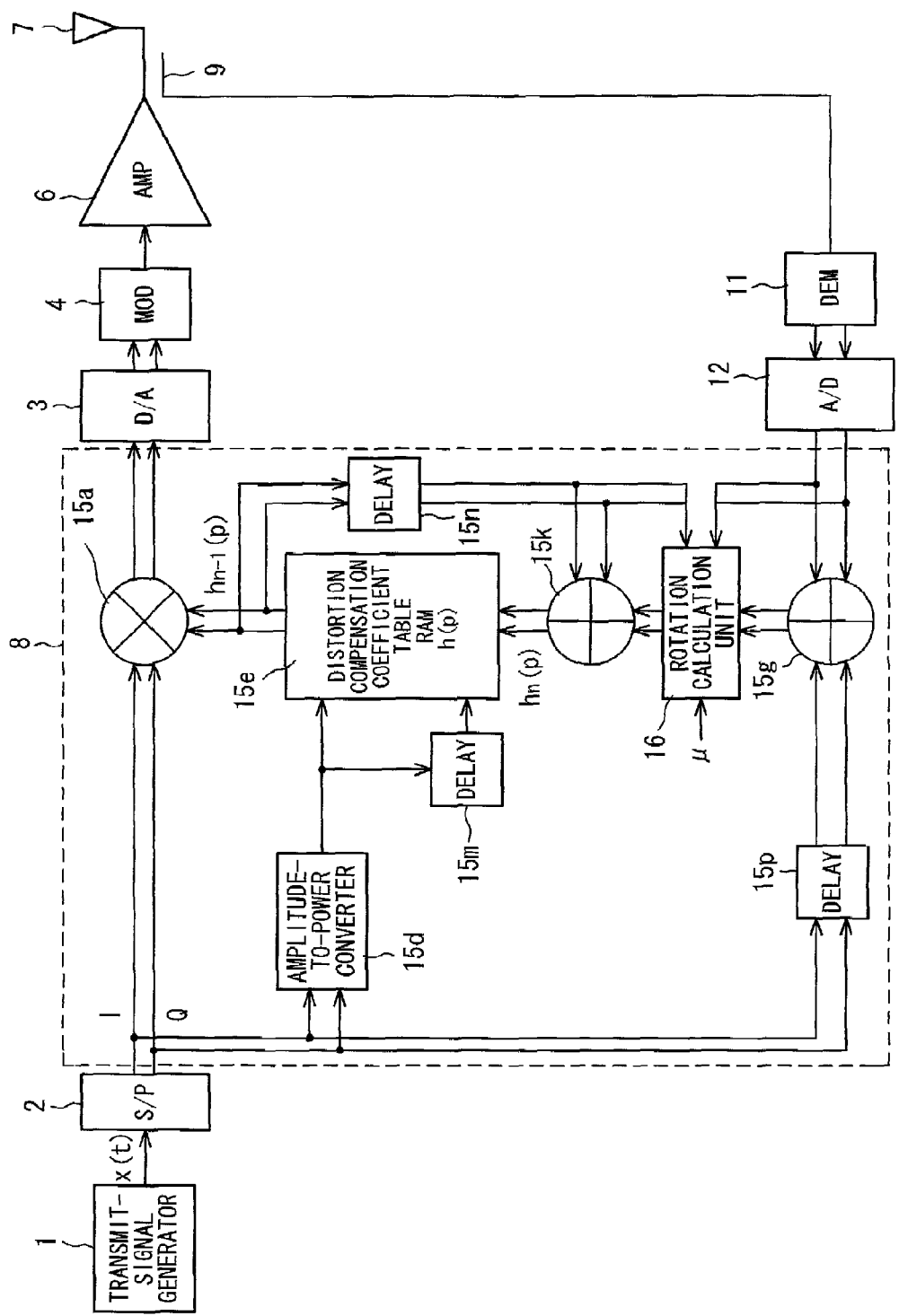
FIG. 27 is a diagram showing the overall structure of a transmitting apparatus according to the prior art.
Figure 28:
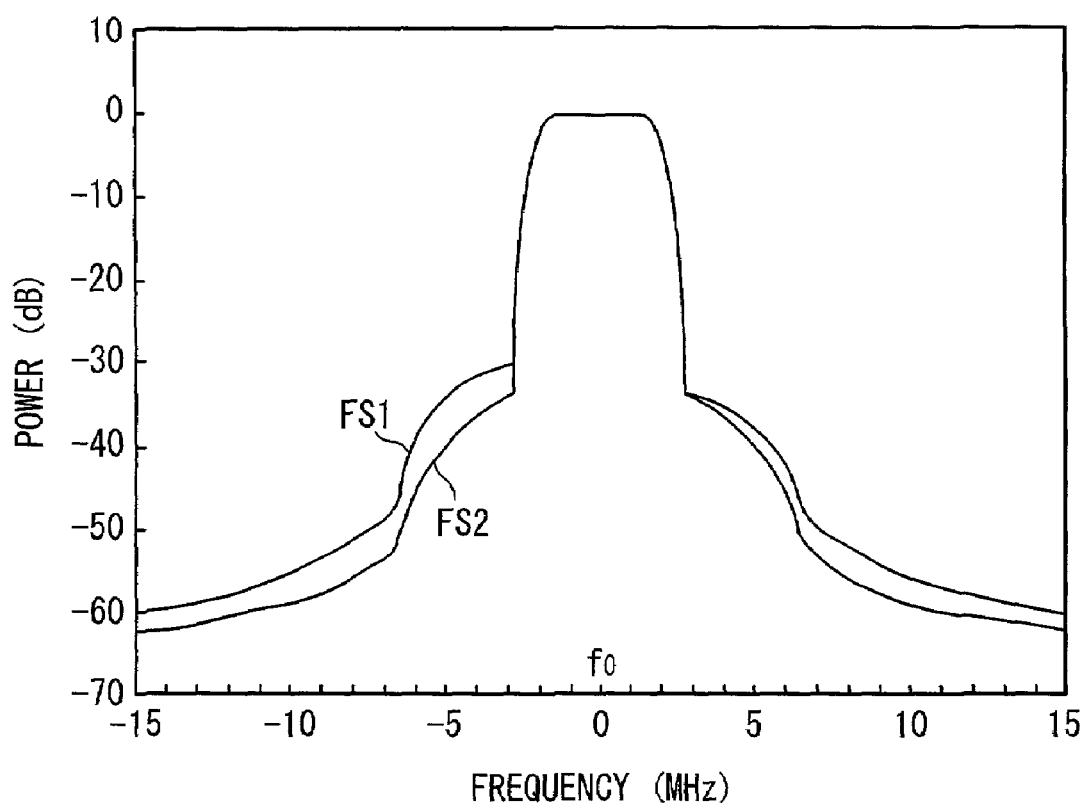
FIG. 28 shows a frequency spectrum characteristic according to the prior art.

In the second embodiment, it is assumed that a distortion compensation coefficient is a function of amplitudes I, Q of a transmit signal and differences Δi, Δq between present amplitude and preceding amplitude of the transmit signal. However, an arrangement can be adopted in which it is assumed that a distortion compensation coefficient is a function of present amplitudes Q(t), I(t) and preceding amplitudes I(t−1), Q(t−1), and the distortion compensation coefficient conforming to the present amplitude and amplitude preceding it is stored in the distortion compensation coefficient table 22. FIG. 21 is a diagram showing the structure of this first modification. This modification differs from the second embodiment in the following respects:

(1) The address generator 23 outputs the address Ai [I(t),I(t−1)] for the real-part table, in which I(t) is the high-order address and I(t−1) the low-order address, and outputs the address Aq [Q(t),Q(t−1)] for the imaginary-part table, in which Q(t) is the high-order address and Q(t−1) the low-order address.

(2) A distortion compensation coefficient conforming to the present amplitude and the amplitude that preceded it is stored in the real-part table and imaginary-part table of the distortion compensation coefficient table 22.

Thus, in accordance with the present invention set forth above, frequency asymmetric distortion can be compensated for so that a satisfactory distortion suppression effect can manifest itself. Further, in accordance with the present invention, it is possible to eliminate a variance in the distortion compensation effect caused by individual differences among devices.

What is claimed is:

1. A distortion compensation method for correcting distortion of a transmission power amplifier in a radio apparatus, comprising:

storing, in memory, distortion compensation coefficients for correcting distortion of the transmission power amplifier; each of which conforms to a transmit signal and a past transmit signal proceeding the transmit signal;

converting a transmit signal to a quadrature signal composed of an in-phase component and a quadrature component;

reading a distortion compensation coefficient, which conforms to a present transmit signal and a past transmit signal, out of the memory in complex form;

applying distortion compensation processing to said quadrature signal by adding a real part and an imaginary part of said distortion compensation coefficient to each of the signal components of said quadrature signal;

applying quadrature modulation to the distortion-compensated quadrature signal, amplifying the quadrature-modulated signal by the transmission power amplifier and transmitting the amplified signal;

eliminating phase rotation, which has been produced by said amplifier, from an output signal of the transmission power amplifier;

demodulating the signal from which said phase rotation has been eliminated; and updating the real part and the imaginary part of said distortion compensation coefficient in such a manner that a difference between in-phase components and a difference between quadrature components of the quadrature signal before distortion compensation and of the demodulated signal will become zero.

2. A distortion compensation method according to claim 1, comprising one distortion compensation coefficient, which corresponds to a present transmit signal and a plurality of signals transmitted in the past, is read out of the memory and distortion compensation processing is executed.

3. A distortion compensation method according to claim 1, wherein one distortion compensation coefficient that corresponds to two signals, namely a present transmit signal and a signal transmitted previously, is read out of the memory and distortion compensation processing is executed.

4. A distortion compensation method according to claim 3, wherein a distortion compensation coefficient, which corresponds to a combination of a present transmit signal and a difference between the present signal and a signal transmitted previously, is read out of the memory and distortion compensation processing is executed.

5. A distortion compensation method according to claim 1, wherein a distortion compensation coefficient, which corresponds to an amplitude value of a present transmit signal and an amplitude value of a signal transmitted in the past, is read out of the memory and distortion compensation processing is executed.

* * * * *